(12) United States Patent
Wang

(10) Patent No.: US 12,453,126 B2
(45) Date of Patent: Oct. 21, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Tai-Yuan Wang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 556 days.

(21) Appl. No.: 17/832,770

(22) Filed: Jun. 6, 2022

(65) Prior Publication Data

US 2023/0395682 A1 Dec. 7, 2023

(51) Int. Cl.
| | |
|---|---|
| H10D 30/67 | (2025.01) |
| H10D 62/10 | (2025.01) |
| H10D 64/01 | (2025.01) |
| H10D 84/01 | (2025.01) |
| H10D 84/03 | (2025.01) |
| H10D 84/85 | (2025.01) |

(52) U.S. Cl.
CPC ..... H10D 30/6735 (2025.01); H10D 30/6757 (2025.01); H10D 62/118 (2025.01); H10D 64/018 (2025.01); H10D 84/017 (2025.01); H10D 84/0177 (2025.01); H10D 84/038 (2025.01); H10D 84/85 (2025.01)

(58) Field of Classification Search
CPC ............. H10D 30/6735; H10D 62/118; H10D 64/018; H10D 84/017; H10D 84/0177; H10D 84/038; H10D 84/85; H10D 84/853; H10D 84/0193
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0134721 A1* | 5/2021 | Chiang ............... H10D 30/6713 |
| 2021/0234017 A1* | 7/2021 | Yao ........................ H10D 30/43 |
| 2021/0313419 A1* | 10/2021 | Lee ....................... H10D 64/666 |

* cited by examiner

Primary Examiner — Brook Kebede
(74) Attorney, Agent, or Firm — McClure, Qualey & Rodack, LLP

(57) ABSTRACT

A method for forming a semiconductor structure is provided. The method includes forming a fin structure over a substrate. The fin structure includes alternately stacking first sacrificial layers and first channel layers. The method also includes forming source/drain features on opposite sidewalls of the fin structure, etching the fin structure to form gate recesses in the fin structure, removing the first sacrificial layers of the fin structure from the gate recesses, thereby forming first gaps exposing the first channel layers, and forming a gate stack in the gate recesses and the first gaps.

20 Claims, 35 Drawing Sheets

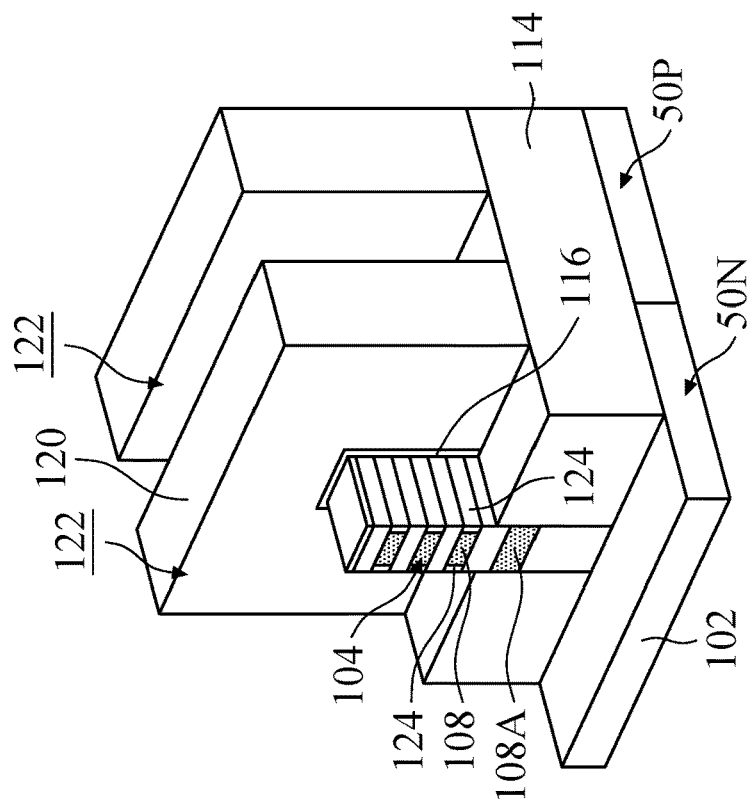
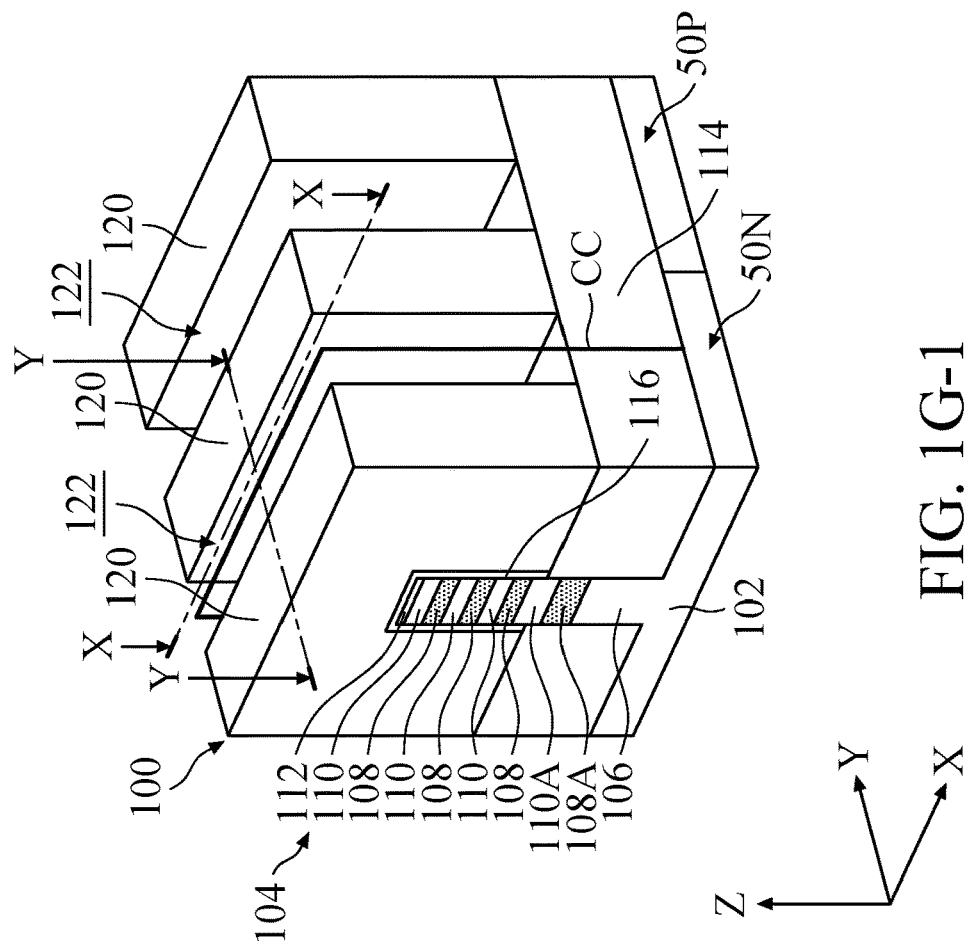
FIG. 1G-1
FIG. 1G-2

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1, 1B-1, 1C-1, 1D-1, 1E-1, 1F-1, 1F-2, 1G-1, 1G-2, 1H-1, 1I-1, 1J-1, 1K-1, 1L-1, 1M-1, 1N-1, 1O-1 and 1P-1 are perspective views illustrating the formation of a semiconductor structure at various intermediate stages, in accordance with some embodiments of the disclosure.

FIGS. 1A-2, 1A-3, 1B-2, 1B-3, 1C-2, 1C-3, 1D-2, 1D-3, 1E-2, 1E-3, 1F-3, 1F-4, 1G-3, 1G-4, 1H-2, 1H-3, 1I-2, 1I-3, 1J-2, 1J-3, 1K-2, 1K-3, 1L-2, 1L-3, 1M-2, 1M-3, 1N-2, 1N-3, 1O-2, 1O-3, 1P-2 and 1P-3 are cross-sectional views illustrating the formation of a semiconductor structure at various intermediate stages, in accordance with some embodiments of the disclosure.

FIG. 3 illustrates a layout of an input/output device, in accordance with some embodiments of the disclosure.

FIGS. 4-1 and 4-2 illustrate a modification of the semiconductor structure of FIGS. 1P-2 and 1P-3, in accordance with some embodiments of the disclosure.

DETAILED DESCRIPTION

Figures 1, 1A:
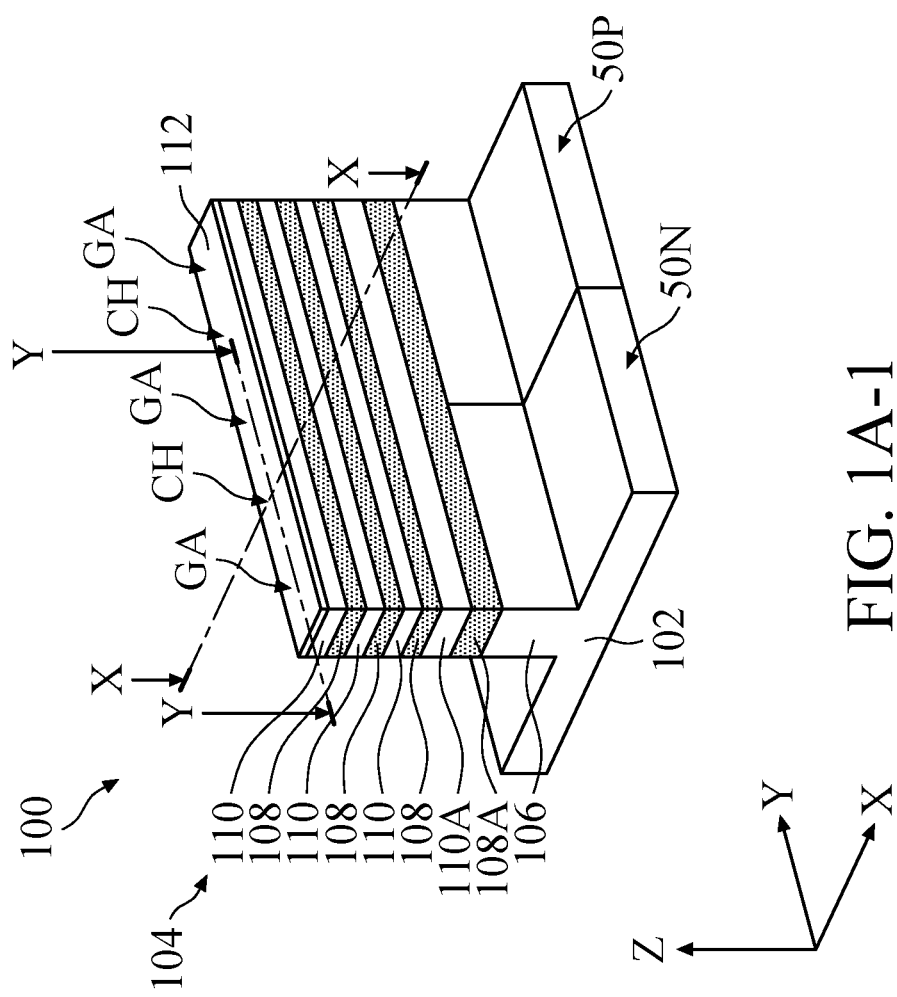

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to integrating an input/output transistor into the manufacturing process for forming nanostructure transistors (such as GAA transistors). As the scaling down of the nanostructure device, the nanostructure transistor (e.g., GAA transistor) may be difficult to meet the need for an input/output transistor that requires a gate dielectric layer having a great effective oxide thickness (EOT). In the manufacturing process for forming nanostructure transistors, the input/output transistor is formed by utilizing a lower fin element of a fin structure as a gate electrode layer of the input/output transistor and replacing the lowermost first semiconductor layer of the fin structure with the gate dielectric layer of the input/output transistor, in accordance with some embodiments. The gate dielectric layer may be formed with a great effective thickness, and thus may meet the need for the input/output transistor. Therefore, the integration of input/output transistors into the manufacturing process for forming nanostructured transistors may be achieved.

FIG. 1A-1 is a perspective view of a semiconductor structure 100 after the formation of a fin structure 104, in accordance with some embodiments. FIG. 1A-2 and FIG. 1A-3 are cross-sectional views of the semiconductor structure 100 taken along Cross-section Y-Y and Cross-section X-X shown in FIG. 1A-1, respectively, in accordance with some embodiments.

In the figures, Cross-section Y-Y is in a plan parallel to the Y direction and through a fin structure, in accordance with some embodiments. Cross-section X-X is in a plan parallel to the X direction and across a channel region of a fin structure and through source/drain features.

A substrate 102 is provided, as shown in FIGS. 1A-1, 1A-2 and 1A-3, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

For a better understanding of the semiconductor structure 100, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

An n-type well region 50N and a p-type well region 50P are formed in a surface portion of the substrate 102, as shown in FIGS. 1A-1, 1A-2 and 1A-3, in accordance with some embodiments. In some embodiments, the n-type well region 50N and the p-type well regions 50P are formed by ion implantation processes. For example, a patterned mask layer (such as a photoresist layer and/or a hard mask layer) is formed to cover regions of the substrate 102 where the p-type well region is predetermined to be formed, and then n-type dopants (such as phosphorus or arsenic) are implanted into the substrate 102, thereby forming the n-type well region 50N, in accordance with some embodiments. Afterward, the patterned mask layer may be removed.

Similarly, a patterned mask layer (such as photoresist layer and/or hard mask layer) is formed to cover regions of the substrate 102 where the n-type well regions are predetermined to be formed, and then p-type dopants (such as boron or $BF_2$) are implanted into the substrate 102, thereby forming the p-type well region 50P, in accordance with some embodiments. Afterward, the patterned mask layer may be removed.

In some embodiments, the doped surface portion of the substrates will be formed as gate electrode layers, and thus is heavily doped. In some embodiments, the respective concentrations of the dopants in the n-type well region 50N and the p-type well region are in a range from about $10^{18}/cm^{-3}$ to about $10^{22}/cm^{-3}$.

A fin structure 104 is formed over the substrate 102, as shown in FIGS. 1A-1, 1A-2 and 1A-3, in accordance with some embodiments. Although one fin structure 104 is shown in FIGS. 1A-1, 1A-2 and 1A-3, the numbers may be more than one. The fin structure 104 has a longitudinal axis parallel to the Y direction, in accordance with some embodiments. The fin structure 104 extends through both the n-type well region 50N and the p-type well region 50P, in accordance with some embodiments. In some embodiments, the fin structure 104 may be also referred to as oxide definition (OD) feature.

The fin structure 104 includes, from bottom to top, a lower fin element 106 and an upper fin element. The lower fin element 106 is formed from the doped surface portion of the substrate 102. The upper fin element is formed from an epitaxial stack that includes alternating first semiconductor layers 108 and 108A and second semiconductor layers 110 and 110A, as shown in FIGS. 1A-1, 1A-2 and 1A-3, in accordance with some embodiments. The lowermost first semiconductor layer 108 is denoted as 108A, and the lowermost second semiconductor layer 110 is denoted as 110A, in accordance with some embodiments.

In the lateral direction, the fin structure 104 is defined as channel regions CH and gate regions GA, where the channel regions CH and the gate regions GA are arranged alternately in the Y direction, in accordance with some embodiments. Source/drain features will be formed on opposite sides of the channel regions CH with respect to the X direction. In this disclosure, a source/drain refers to a source and/or a drain. It should be noted that, in the present disclosure, a source and a drain are interchangeably used and the structures thereof are substantially the same. The current of the resulting semiconductor device flows in the X direction through the channel. The X direction may also be referred to as the current direction.

The upper fin element (excluding 108A) in the gate regions GA and the first semiconductor layers 108 (excluding 108A) of the upper fin element in the channel regions CH will be removed and replaced with a gate stack, in accordance with some embodiments. The Y direction may also be referred to as a gate-extending direction. In some embodiments, the gate region GA corresponds to the boundary between the n-type well region 50N and the p-type well region 50P.

The formation of the fin structure 104 includes forming an epitaxial stack over the substrate 102 using an epitaxial growth process, in accordance with some embodiments. The epitaxial stack includes alternating the first semiconductor layers 108 (and 108A) with the second semiconductor layers 110 (and 110A), in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 108A and 108 are made of a first semiconductor material, and the second semiconductor layers 110A and 110 are made of a second semiconductor material. The first semiconductor material has a different lattice constant than the second semiconductor material, in accordance with some embodiments. In some embodiments, the first semiconductor material and the second semiconductor material have different oxidation rates and/or etching selectivity. In some embodiments, the first semiconductor layers 108A and 108 are made of SiGe, where the percentage of germanium (Ge) in the SiGe is in a range of about 20 atomic % to about 50 atomic %, and the second semiconductor layers 110A and 110 are made of pure or substantially pure silicon. In some embodiments, the first semiconductor layers 108A and 108 are $Si_{1-x}Ge_x$, where x is more than about 0.3, or Ge (x=1.0) and the second semiconductor layers 110A and 110 are Si or $Si_{1-y}Ge_y$, where y is less than about 0.4, and x>y.

The first semiconductor layers 108A and 108 are configured as sacrificial layers, where the lowermost first semiconductor layer 108A will be removed and replaced with a gate dielectric layer for an input/output transistor, and the first semiconductor layers 108 will be removed and replaced with the gate stack for a core transistor, in accordance with some embodiments. The second semiconductor layers 110A and 110 will form nanostructures (e.g., nanowires or nanosheets) that serve as the channel layers for the resulting semiconductor devices (e.g., an input/output transistor and/or a core transistor). As the term is used herein, "nanostructures" refers to semiconductor layers that are spaced apart from one another and have cylindrical shapes, bar shapes and/or sheet shapes.

In some embodiments, the thickness of each of the first semiconductor layers 108 is in a range of about 5 nm to about 10 nm. In some embodiments, the thickness of the lowermost first semiconductor layer 108A is in a range of about 3 nm to about 10 nm. The thickness of the lowermost first semiconductor layer 108A may be thinner, equal to, or thicker than the thickness of the overlying first semiconductor layers 108.

In some embodiments, the thickness of each of the second semiconductor layers 110 is in a range of about 5 nm to about 10 nm. In some embodiments, the thickness of the lowermost second semiconductor layer 110A is greater than the overlying second semiconductor layers 110 and is in a range of about 15 nm to about 30 nm.

In some embodiments, the number of first semiconductor layers 108A and 108 is the same as the number of second semiconductor layers 110A and 110. In alternative embodiments, the number of first semiconductor layers 108A and 108 is one more than the number of second semiconductor layers 110A and 110. Although four first semiconductor layers 108 and 108A are shown in FIGS. 1A-1, 1A-2 and 1A-3, the numbers are not limited thereto and may be 2, 3 or more than 4. By adjusting the number of semiconductor layers, a driving current of the resulting nanostructure device can be adjusted.

The epitaxial stack (including the first semiconductor layers 108A and 108 and the second semiconductor layers 110A and 110) and the substrate 102 are then patterned into the fin structure 104, in accordance with some embodiments. In some embodiments, the patterning process includes forming a patterned hard mask layer over the epitaxial stack.

The patterning process also includes performing an etching process to remove portions of the epitaxial stack and the substrate 102 uncovered by the patterned hard mask layers, thereby forming trenches and the fin structure 104 protruding from between the trenches, in accordance with some embodiments. The etching process may be an anisotropic etching process, e.g., dry plasma etching. After the etching process, a remaining portion of the patterned hard mask layer leaves on the upper surface of the fin structure 104 and is referred to as a mask layer 112. In some embodiments, the mask layer 112 is made of dielectric material, such as silicon oxynitride (SiON), silicon nitride (SiN), silicon carbon nitride (SiCN), silicon oxycarbonitride (SiOCN), oxygen-doped silicon carbonitride (Si(O)CN), and/or silicon oxide ($SiO_2$).

The doped surface portion of the substrate 102 protruding from between the trenches serves as the lower fin element 106 of the fin structure 104, in accordance with some embodiments. As a result, the lower fin element 106 in the n-type region 50N has n-type conductivity, and the lower fin element 106 in the p-type region 50P has p-type conductivity, in accordance with some embodiments. The remainder of the epitaxial stack forms the upper fin element of the fin structure 104 over the lower fin element 106, in accordance with some embodiments. In some embodiments, the concentrations of the dopants in the lower fin element 106 is in a range from about $10^{18}/cm^{-3}$ to about $10^{22}/cm^{-3}$. In some embodiments, the upper fin element is undoped.

Figures 1, 1A, 2, 3:
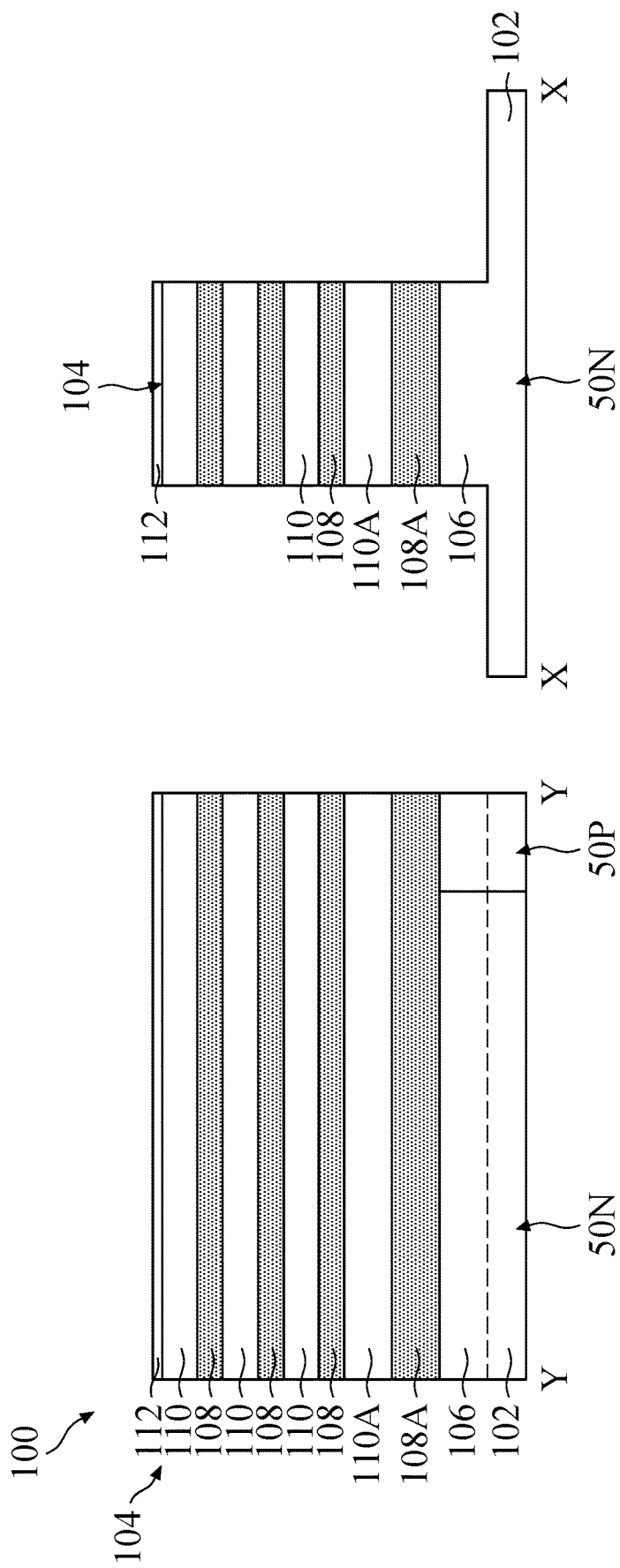
Figures 1, 1B:
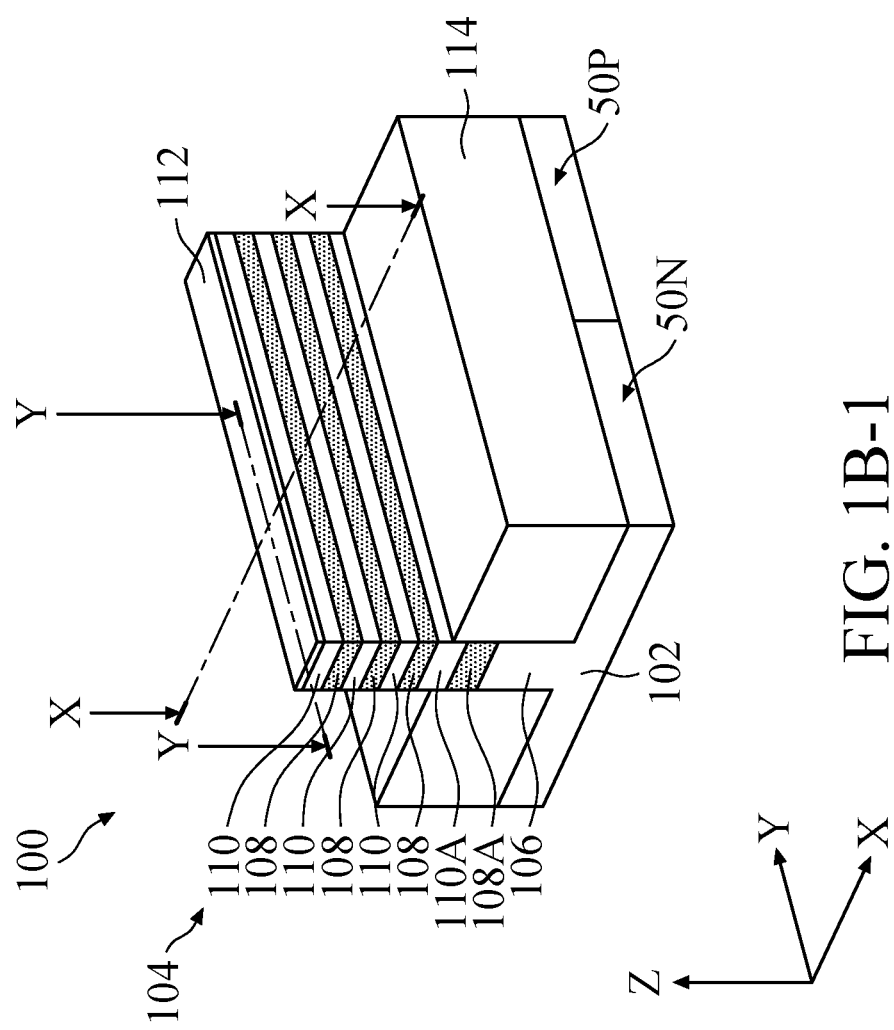
Figures 1, 1B, 2, 3:
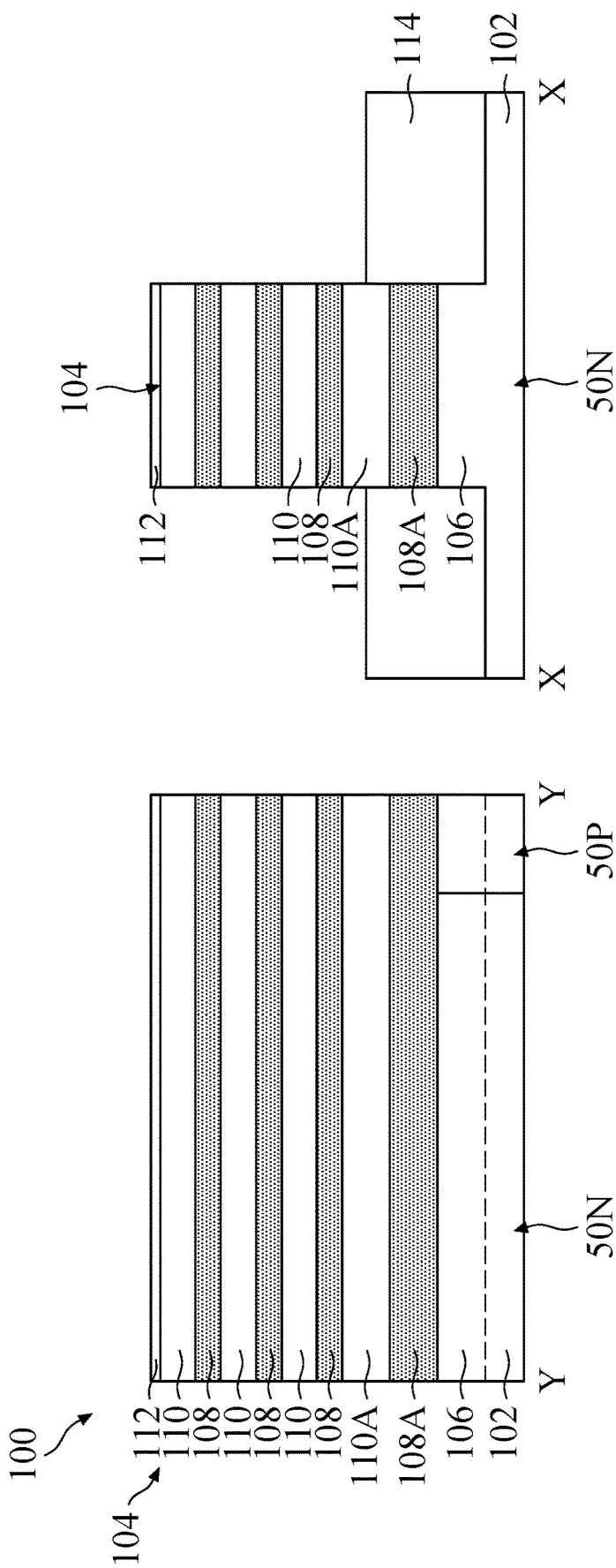

FIG. 1B-1 is a perspective view of a semiconductor structure 100 after the formation of an isolation structure 114, in accordance with some embodiments. FIG. 1B-2 and FIG. 1B-3 are cross-sectional views of the semiconductor structure 100 taken along Cross-section Y-Y and Cross-section X-X shown in FIG. 1B-1, in accordance with some embodiments.

An isolation structure 114 is formed over the substrate 102, as shown in FIGS. 1B-1, 1B-2 and 1B-3, in accordance with some embodiments. The isolation structure 114 may be also referred to as shallow trench isolation (STI) feature. In some embodiments, the isolation structure 114 partially surrounds fin structure 104.

In some embodiments, the isolation structure 114 is made of dielectric material such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the isolation structure 114 and the mask layer 112 are made of different materials and have a great difference in etching selectivity.

In some embodiments, the formation of the isolation structure 114 includes depositing a dielectric material for the isolation structure 114 to overfill the trenches. The dielectric material is formed over the upper surfaces of the fin structure 104, in accordance with some embodiments. In some embodiments, the dielectric material is deposited using chemical vapor deposition (CVD) (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof.

The dielectric material over the upper surfaces of the fin structure 104 is planarized to expose the top surface of the mask layer 112, for example, using chemical mechanical polishing (CMP), etching back process, or a combination thereof, in accordance with some embodiments.

The dielectric material is further recessed until the sidewalls of the lowermost second semiconductor layer 110A are exposed, in accordance with some embodiments. The recessing process may be an anisotropic etching process such as dry plasma etching, an isotropic etching process such as dry chemical etching, remote plasma etching or wet chemical etching, and/or a combination thereof. A remainder of the dielectric material serves as the isolation structure 114, in accordance with some embodiments. In some embodiments, the thickness of the isolation structure 114 is in a range from about 60 nm to about 120 nm.

The isolation structure 114 has a top surface that is located at a level between the top surface and the bottom surface of the lowermost second semiconductor layer 110A. In some embodiments, the upper portion of the sidewalls of the lowermost second semiconductor layer 110A is exposed while the lower portion of the sidewalls of the lowermost second semiconductor layer 110A is covered by the isolation structure 114. The lowermost second semiconductor layer 110A having a greater thicker may be helpful in controlling the endpoint of the etching process to prevent the lowermost second semiconductor layer 108A from being exposed.

Figures 1, 1C:
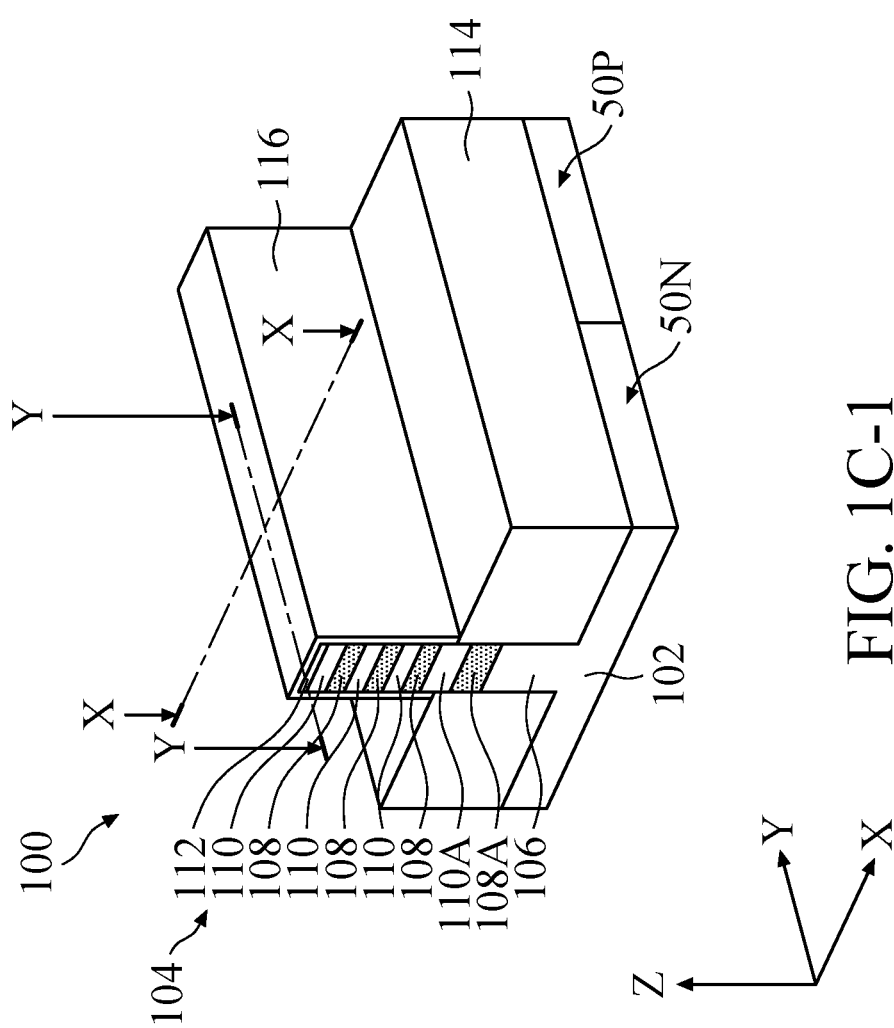
Figures 1, 1C, 2, 3:
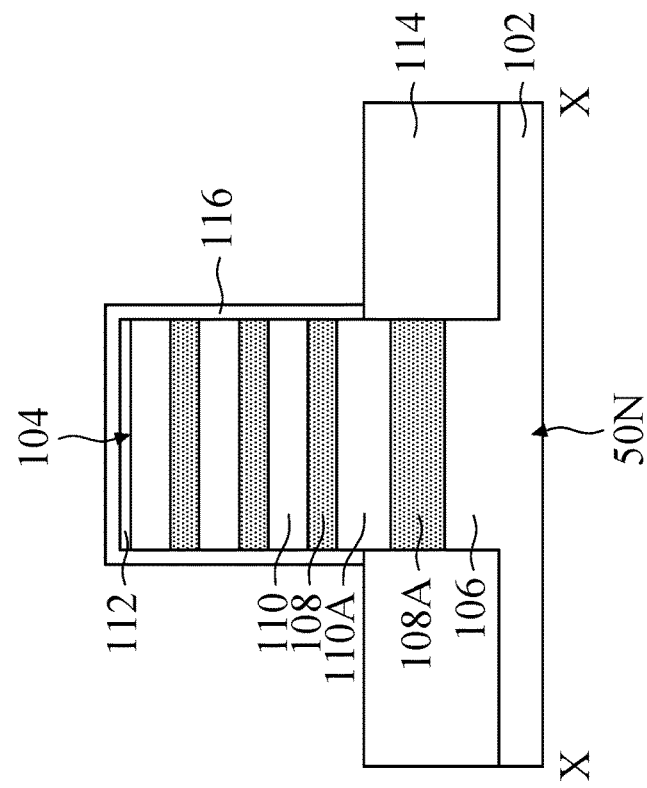
Figures 1, 1C, 2:
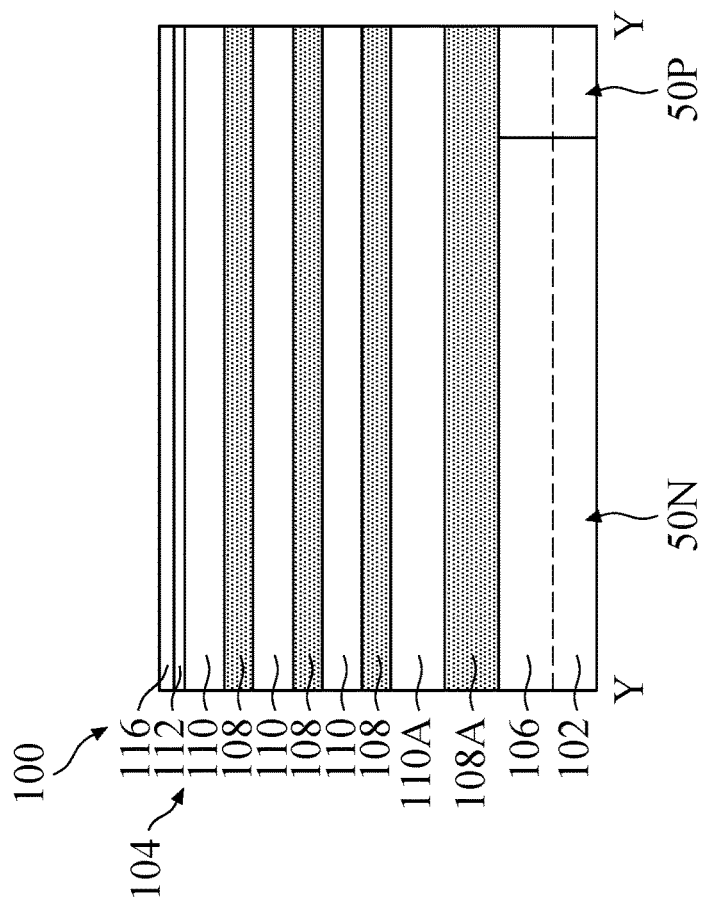

FIG. 1C-1 is a perspective view of a semiconductor structure 100 after the formation of a lining layer 116, in accordance with some embodiments. FIG. 1C-2 and FIG. 1C-3 are cross-sectional views of the semiconductor structure 100 taken along Cross-section Y-Y and Cross-section X-X shown in FIG. 1C-1, in accordance with some embodiments.

A lining layer 116 is conformally formed along the semiconductor structure 100, as shown in FIGS. 1C-1, 1C-2 and 1C-3, in accordance with some embodiments. The lining layer 116 covers the exposed sidewalls of the fin structure 104, in accordance with some embodiments. In some embodiments, the lining layer 116 is configured to protect the fin structure 104 from being damaged during subsequent etching processes.

In some embodiments, the lining layer 116 is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the lining layer 116 and the isolation structure 114 are made of the same material, and thus the portion of the lining layer 116 formed along the top surface of the isolation structure 114 is formed as a portion of the isolation structure 114. In some embodiments, the lining layer 116 is deposited using ALD, CVD (such as LPCVD, PECVD, or HDP-CVD), another suitable technique, and/or a combination thereof.

Figures 1, 1D:
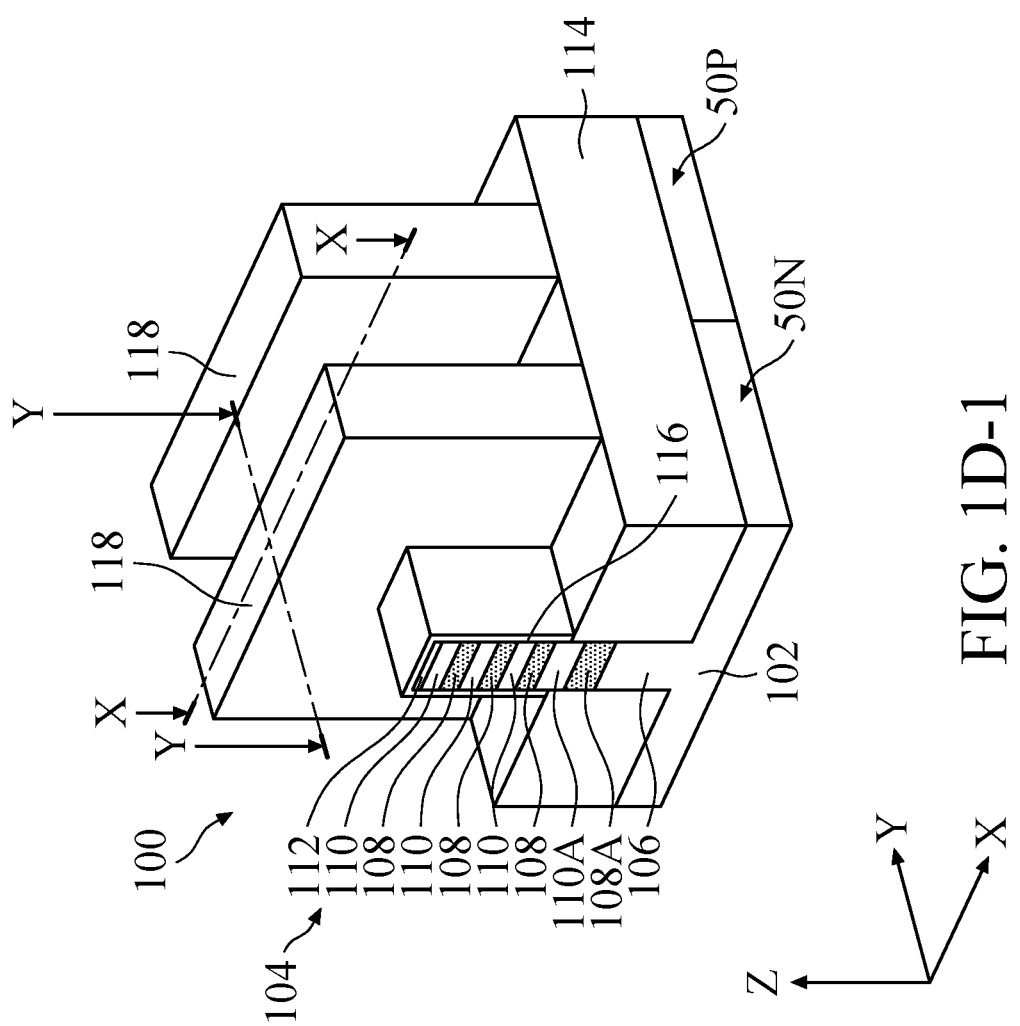
Figures 1, 1D, 2, 3:
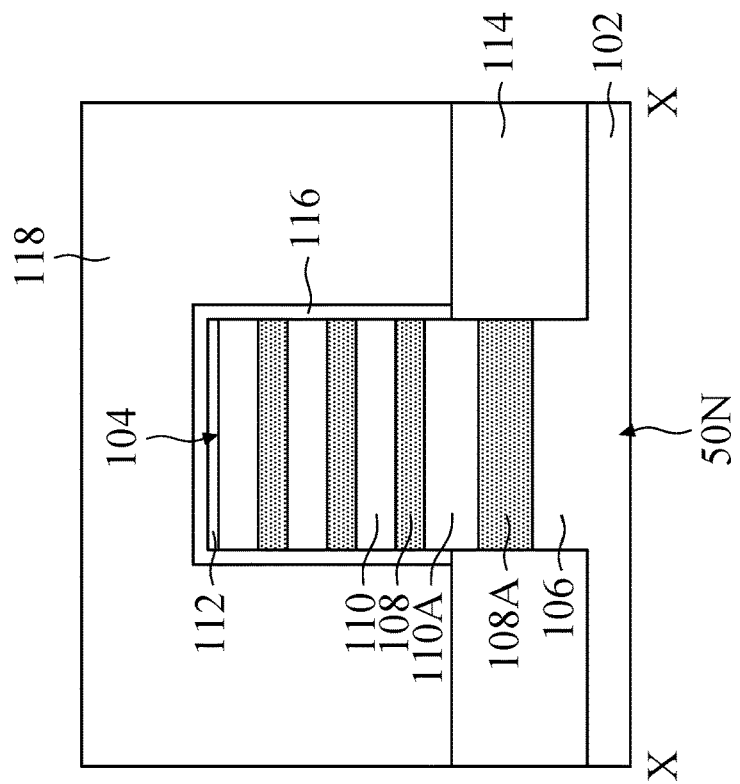
Figures 1, 1D, 2:
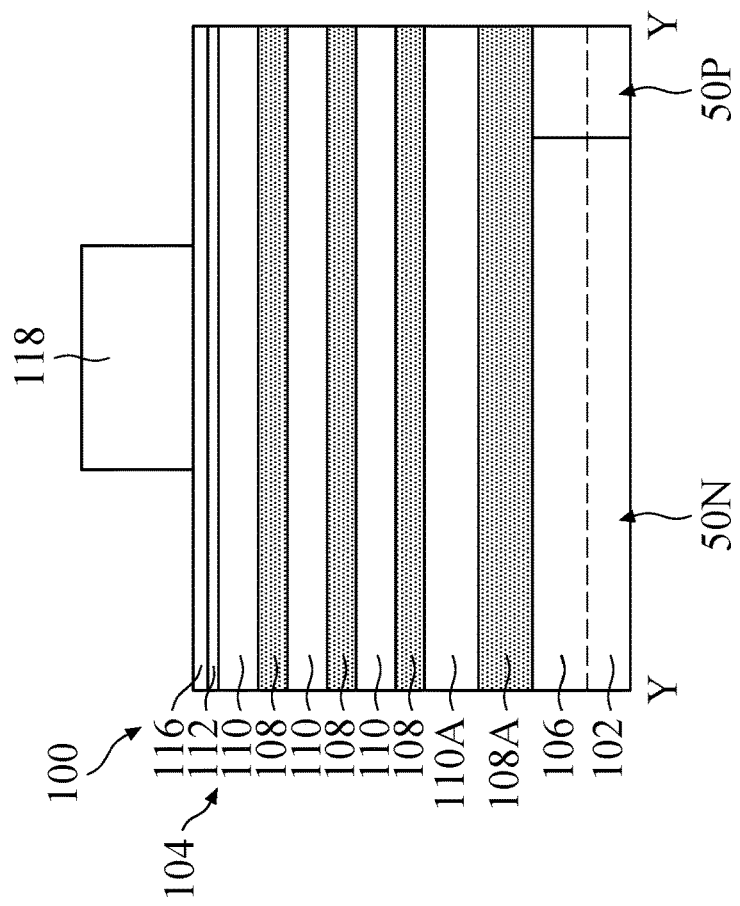

FIG. 1D-1 is a perspective view of a semiconductor structure 100 after the formation of semiconductor walls 118, in accordance with some embodiments. FIG. 1D-2 and FIG. 1D-3 are cross-sectional views of the semiconductor structure 100 taken along Cross-section Y-Y and Cross-section X-X shown in FIG. 1D-1, in accordance with some embodiments.

Semiconductor walls 118 are formed over the semiconductor structure 100, as shown in FIGS. 1D-1, 1D-2 and 1D-3, in accordance with some embodiments. The semiconductor walls 118 extend over and cover the channel regions CH of the fin structure 104, in accordance with some embodiments. The semiconductor walls 118 extend in the X direction and are arranged substantially parallel to one another in the Y direction, in accordance with some embodiments. That is, the semiconductor walls 118 have longitudinal axes parallel to the X direction, in accordance with some embodiments.

The semiconductor walls 118 are made of semiconductor material such as polysilicon and/or poly-silicon germanium. In some embodiments, the formation of the semiconductor walls 118 includes depositing a semiconductor material for the semiconductor walls 118, planarizing the semiconductor material, and patterning the semiconductor material into the semiconductor walls 118. In some embodiments, the semiconductor walls 118 is formed using CVD, another suitable technique, and/or a combination thereof.

The patterning process includes forming a patterned mask layer (not shown) over the semiconductor material using a photolithography process, and etching the semiconductor material uncovered by the patterned mask layer until the lining layer 116 is exposed, in accordance with some embodiments. The etching process may be an anisotropic etching process, e.g., dry plasma etching.

Figures 1, 1E:
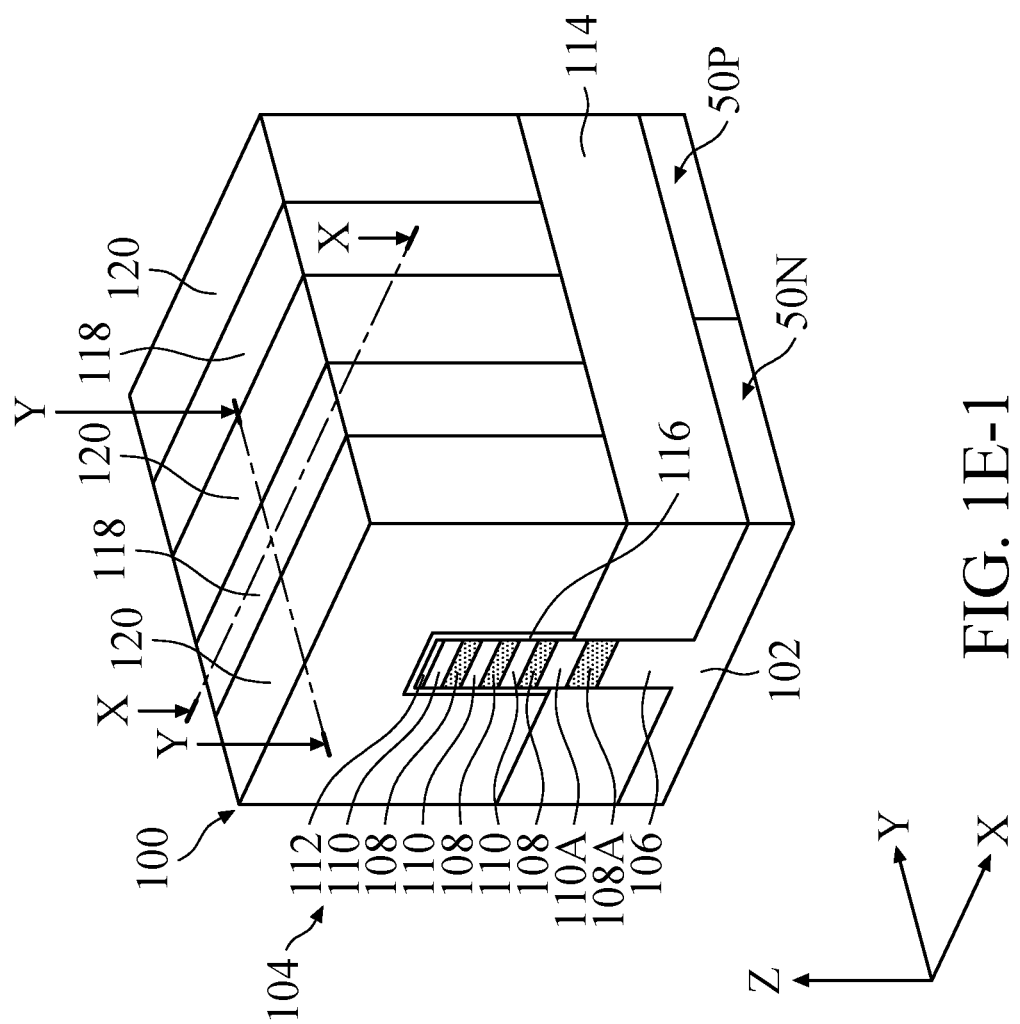
Figures 1, 1E, 2, 3:
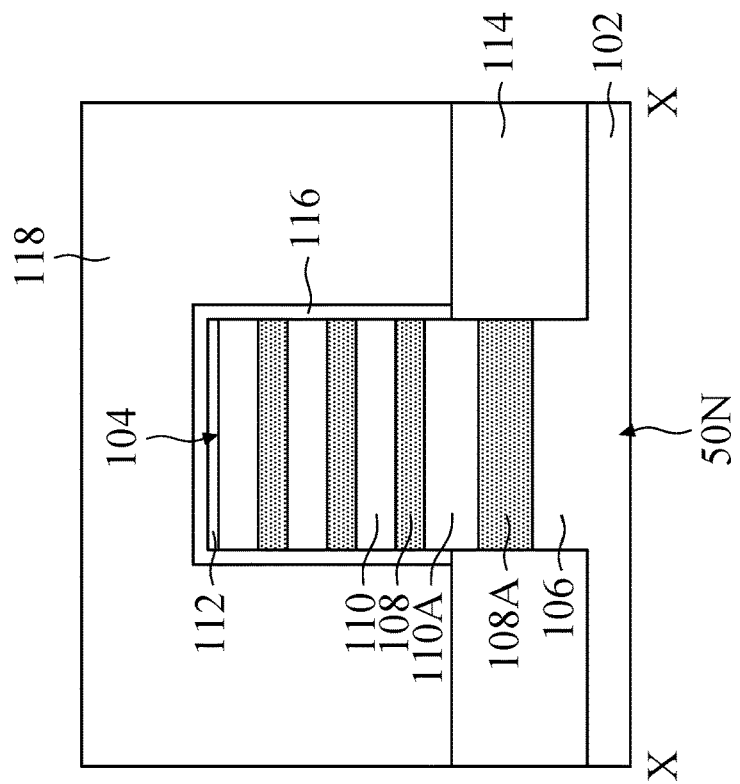
Figures 1, 1E, 2:
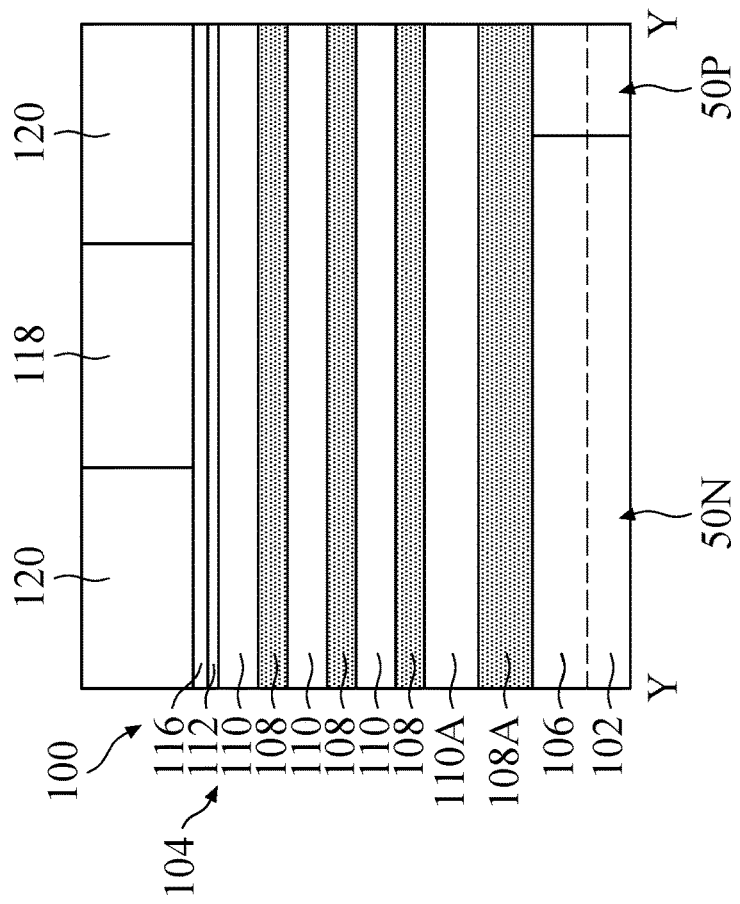

FIG. 1E-1 is a perspective view of a semiconductor structure 100 after the formation of dielectric walls 120, in accordance with some embodiments. FIG. 1E-2 and FIG. 1E-3 are cross-sectional views of the semiconductor structure 100 taken along Cross-section Y-Y and Cross-section X-X shown in FIG. 1E-1, in accordance with some embodiments.

Dielectric walls 120 are formed over the semiconductor structure 100 to fill the trenches between the semiconductor walls 118, as shown in FIGS. 1E-1 and 1E-2, in accordance with some embodiments. The dielectric walls 120 extend over and cover the gate regions GA of the fin structure 104, in accordance with some embodiments. The dielectric walls 120 extend in the X direction and are arranged substantially parallel to one another in the Y direction, in accordance with some embodiments. That is, the dielectric walls 120 have longitudinal axes parallel to the X direction, in accordance with some embodiments. In some embodiments, the semiconductor walls 118 and the dielectric walls 120 are arranged alternately.

In some embodiments, the dielectric walls 120 are made of dielectric material such $Al_2O_3$, SiO, another suitable, or a combination thereof. In some embodiments, the formation of the dielectric walls 120 includes depositing a dielectric material for the dielectric walls 120 to overfill the trenches between the semiconductor walls 118, and planarizing the dielectric material until the semiconductor walls 118 are exposed. The deposition processes may be ALD, CVD (such as LPCVD, PECVD, HDP-CVD, HARP, and FCVD), another suitable method, and/or a combination thereof. The planarization process may be CMP, etching back process, or a combination thereof, in accordance with some embodiments.

Figures 1, 1F, 2:
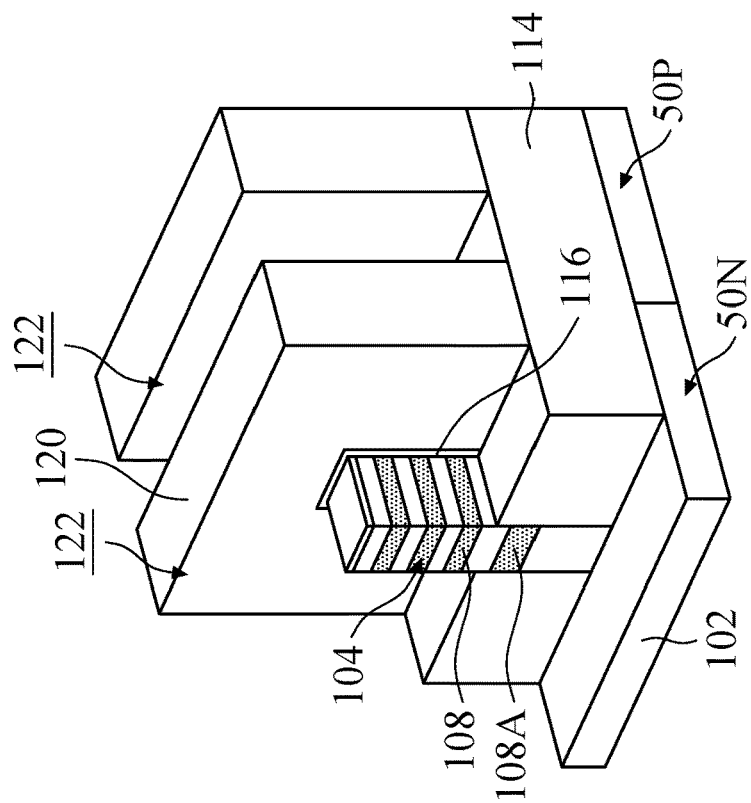
Figures 1, 1F:
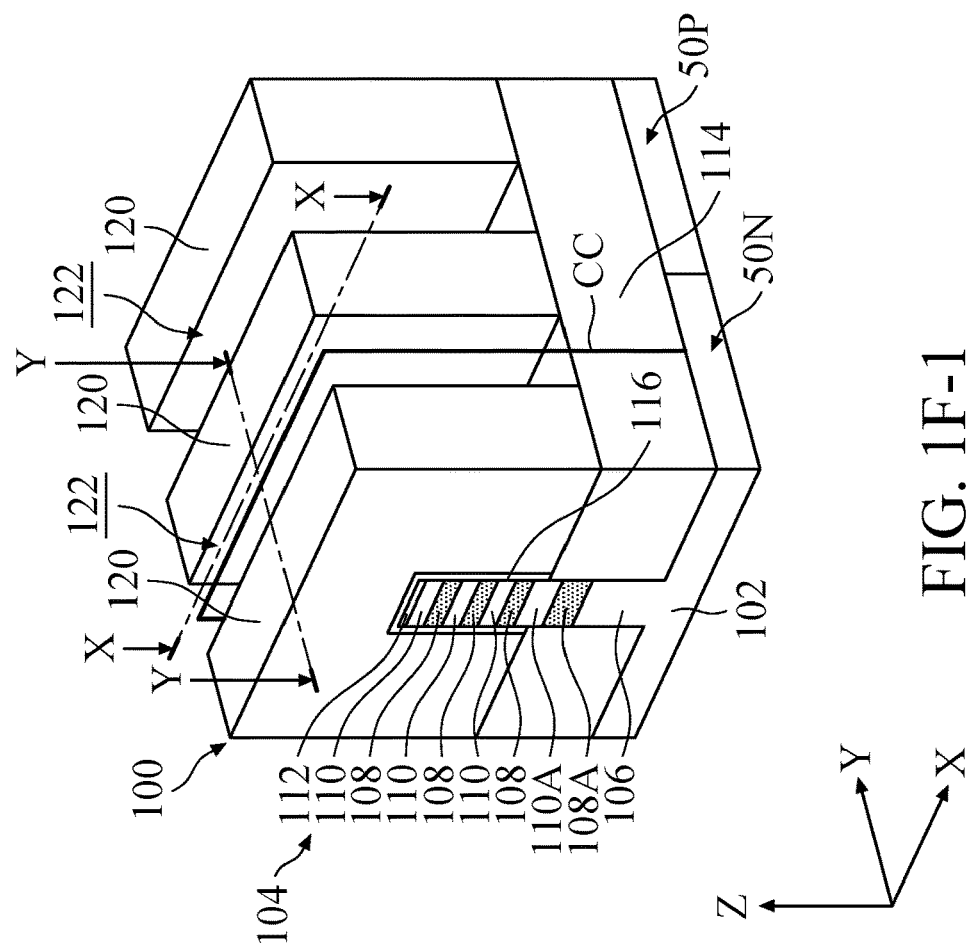

FIG. 1F-1 is a perspective view of a semiconductor structure 100 after the removal of the semiconductor walls 116, in accordance with some embodiments. FIG. 1F-2 is a perspective view illustrating the cutting of the semiconductor structure 100 of FIG. 1F-1 through plan CC, in accordance with some embodiments. FIG. 1F-3 and FIG. 1F-4 are cross-sectional views of the semiconductor structure 100 taken along Cross-section Y-Y and Cross-section X-X shown in FIG. 1F-1, in accordance with some embodiments.

The semiconductor walls 118 are removed using an etching process to form source/drain trenches 122, as shown in FIGS. 1F-1, 1F-2, 1F-3 and 1F-4, in accordance with some embodiments. In some embodiments, the etching process is an isotropic etching such as wet chemical etching, dry chemical etching, remote plasma etching, another suitable technique, and/or a combination thereof. For example, when semiconductor walls 118 are made of polysilicon, a wet etchant such as a tetramethylammonium hydroxide (TMAH) solution may be used to selectively remove the semiconductor walls 118.

Portions of the lining layer 116 exposed from the source/drain trenches 122 are then removed using an etching process, as shown in FIGS. 1F-1, 1F-2, 1F-3 and 1F-4, in accordance with some embodiments. In some embodiments, the etching process is anisotropic etching process, e.g., dry plasma etching, an isotropic etching such as dry chemical etching, remote plasma etching, or wet chemical etching, another suitable technique, and/or a combination thereof. In some embodiments, the source/drain trench 122 exposes the channel regions CH of the fin structure 104 and the mask layer 112.

Figures 1, 1F, 2, 3, 4:
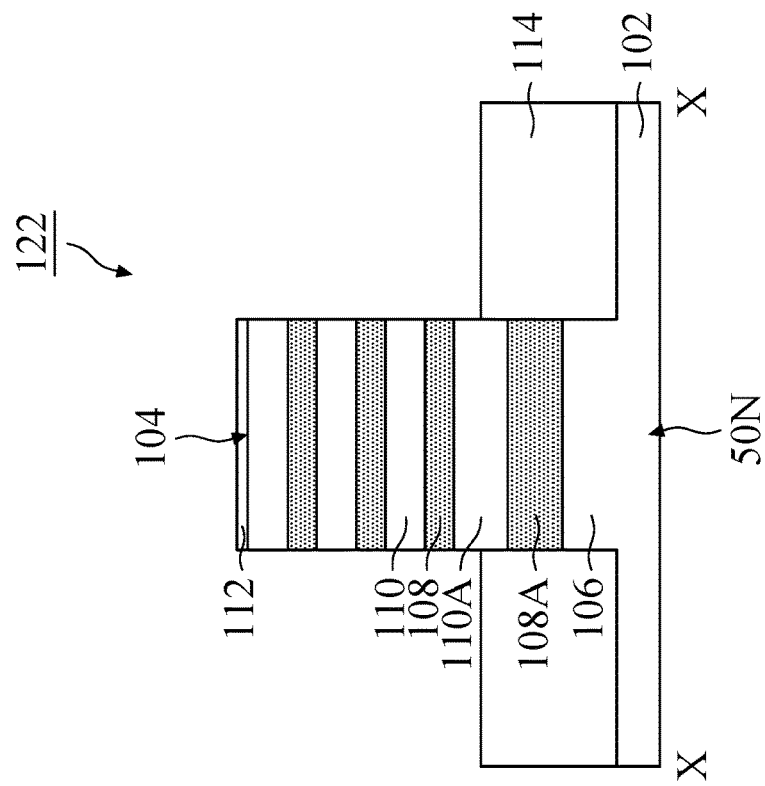
Figures 1, 1F, 2, 3:
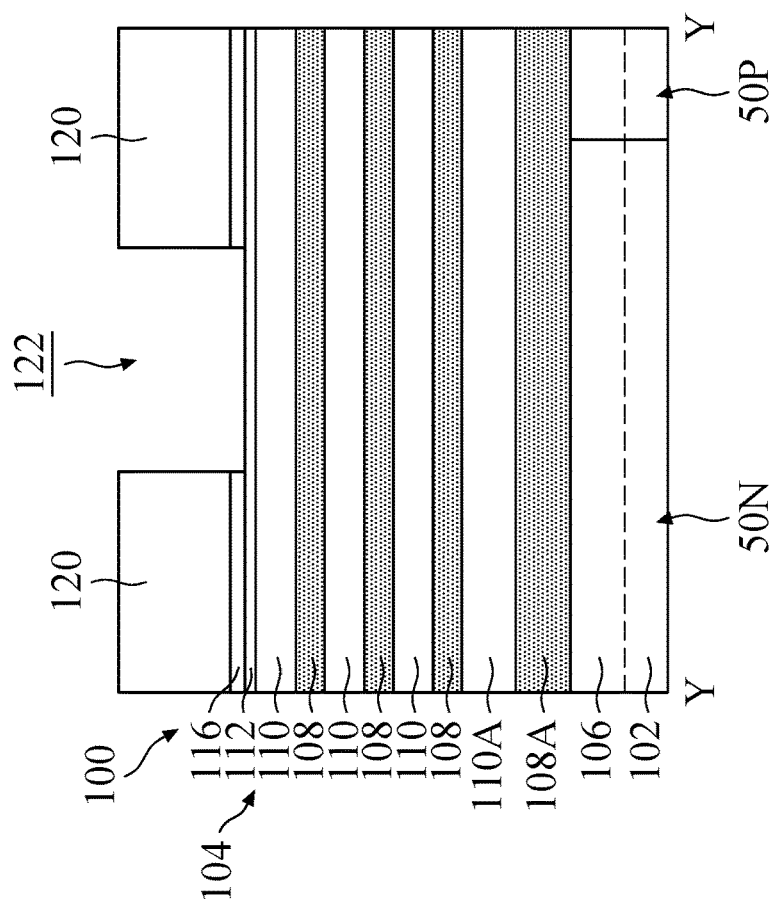
Figures 1, 1G, 2, 3, 4:
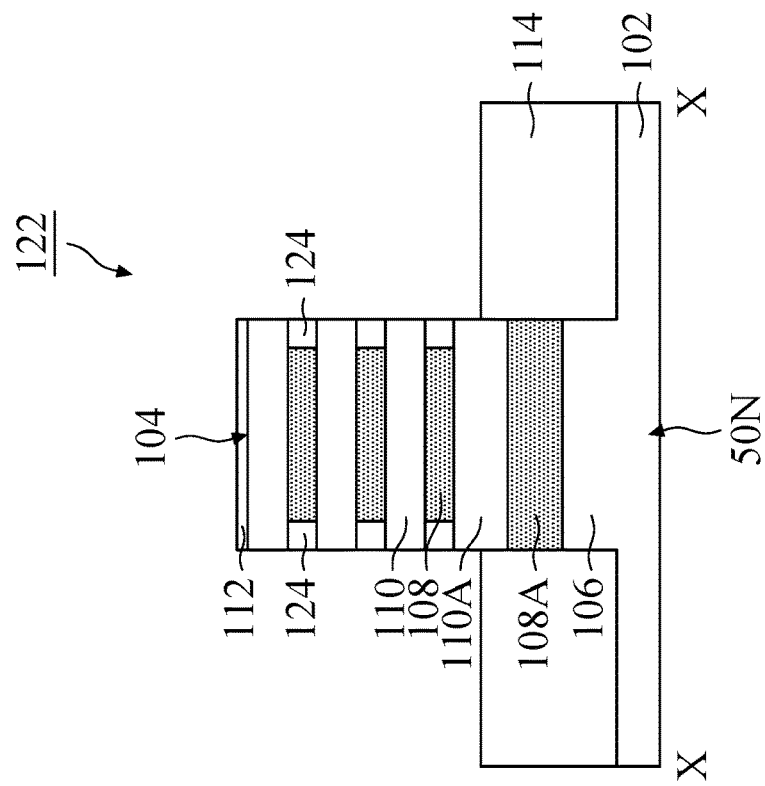
Figures 1, 1G, 2, 3:
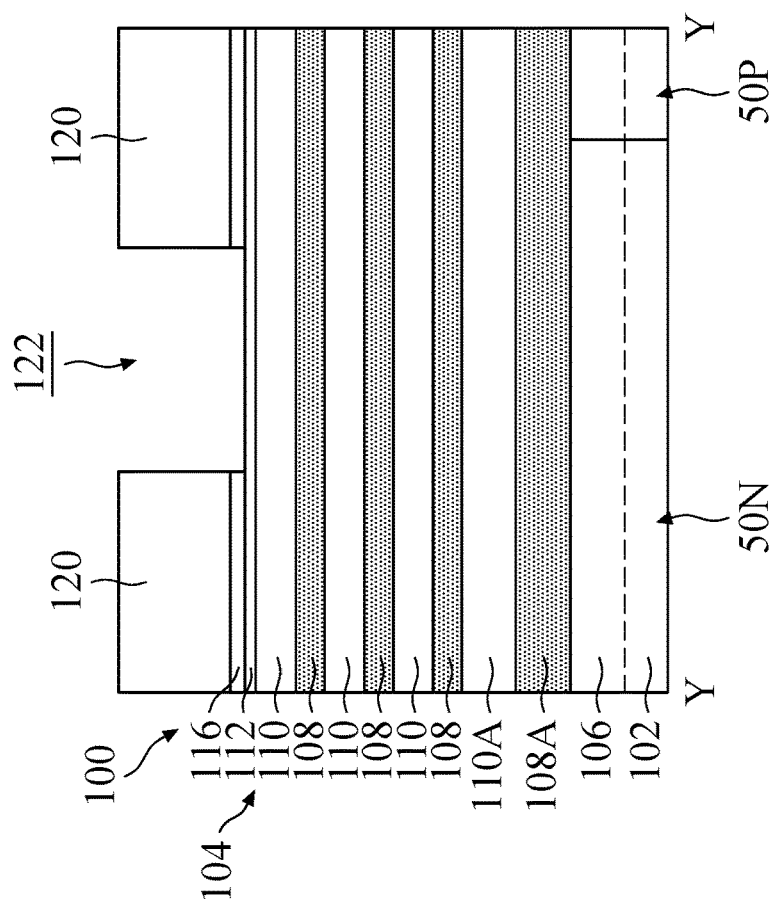

FIG. 1G-1 is a perspective view of a semiconductor structure 100 after the formation of inner spacer layers 124, in accordance with some embodiments. FIG. 1G-2 is a perspective view illustrating the cutting of the semiconductor structure 100 of FIG. 1G-1 through plan CC, in accordance with some embodiments. FIG. 1G-3 and FIG. 1G-4 are cross-sectional views of the semiconductor structure 100 taken along Cross-section Y-Y and Cross-section X-X shown in FIG. 1G-1, in accordance with some embodiments.

In some embodiments, the inner spacer layers 124 are formed on opposite sidewalls of the first semiconductor layers 108 (excluding 108A) of the fin structure 104, as shown in FIGS. 1G-2, 1G-4, in accordance with some embodiments. The inner spacer layers 124 interpose subsequently formed source/drain features and gate stack to avoid the source/drain features and the gate stack from being in direct contact and are configured to reduce the parasitic capacitance between the gate stack and the source/drain features (i.e., Cgs and Cgd), in accordance with some embodiments.

In some embodiments, the inner spacer layers 124 are made of dielectric material, such as silicon oxynitride (SiON), silicon nitride (SiN), silicon carbon nitride (SiCN), silicon oxycarbonitride (SiOCN), oxygen-doped silicon carbonitride (Si(O)CN), and/or silicon oxide ($SiO_2$). In some embodiments, the inner spacer layers 124 are made of low-k dielectric materials. For example, the dielectric constant of the inner spacer layers 124 may be lower than a k-value of silicon oxide (SiO), such as lower than 4.2, equal to or lower than about 3.9, such as in a range of about 3.5 to about 3.9.

In some embodiments, the formation of the inner spacer layers 124 includes laterally recessing the first semiconductor layers 108 from the source/drain trenches 122 to form notches. In some embodiments, the recessing process is an isotropic etching such as dry chemical etching, remote plasma etching, wet chemical etching, another suitable technique, and/or a combination thereof. The lowermost first semiconductor layer 108A is protected by the isolation structure 114, and thus is not laterally recessed.

In some embodiments, the formation of the inner spacer layers 124 also includes depositing a dielectric material for the inner spacer layers 124 over the semiconductor structure 100 to overfill the notches, and then etching back the dielectric material to remove the dielectric material outside the notches. In some embodiments, the deposition process includes ALD, CVD (such as PECVD, LPCVD or HARP), another suitable technique, and/or a combination thereof. In some embodiments, the etching back process includes an anisotropic etching process such as dry plasma etching, an isotropic etching process such as dry chemical etching, remote plasma etching or wet chemical etching, and/or a combination thereof. Portions of the dielectric material remaining in the notches serve as the inner spacer layers 124, in accordance with some embodiments.

Figures 1, 1H:
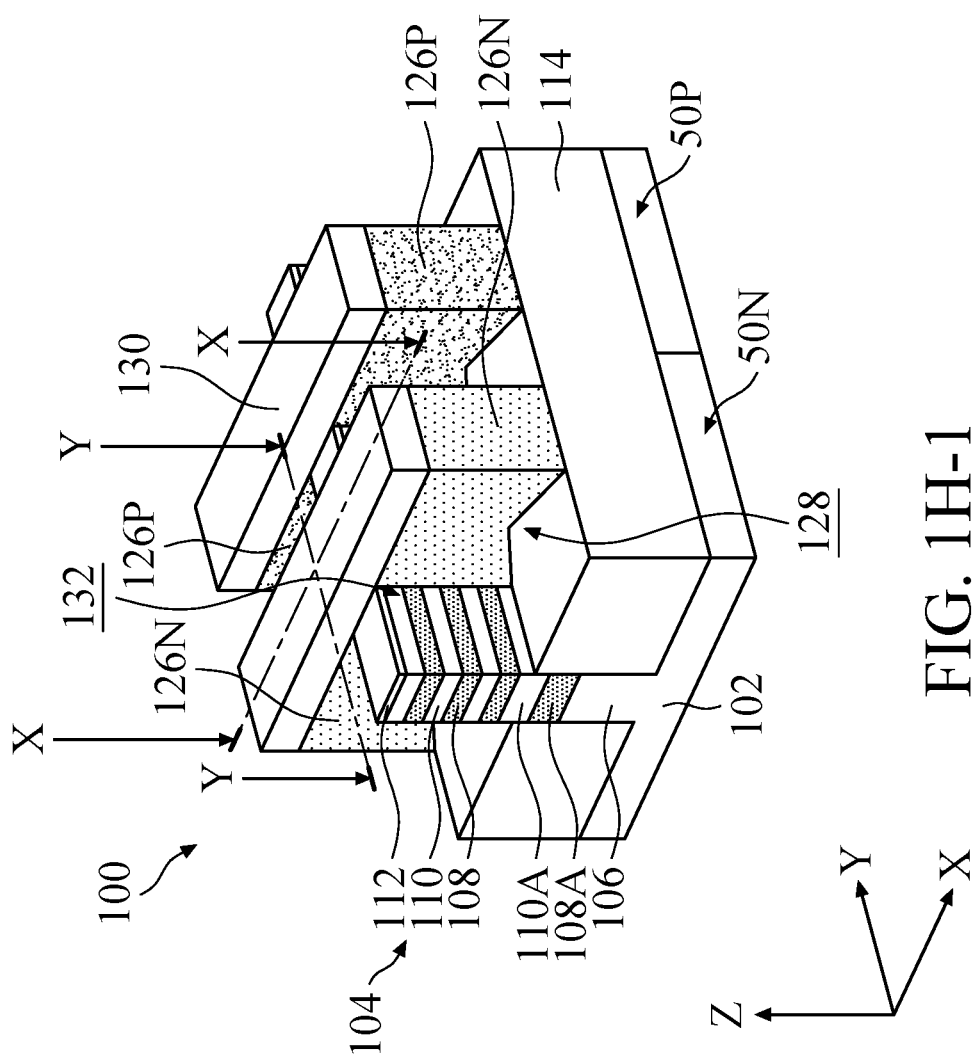
Figures 1, 1H, 2, 3:
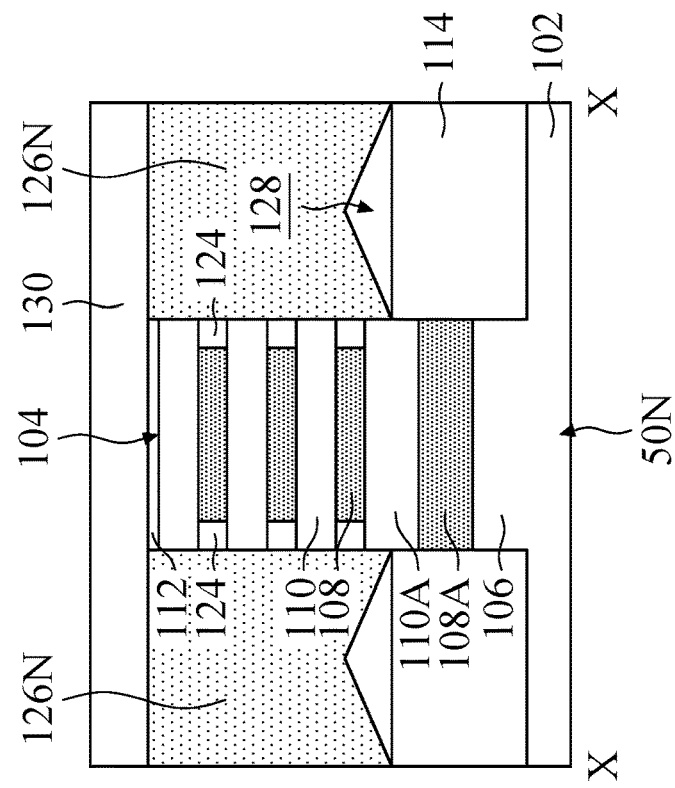
Figures 1, 1H, 2:
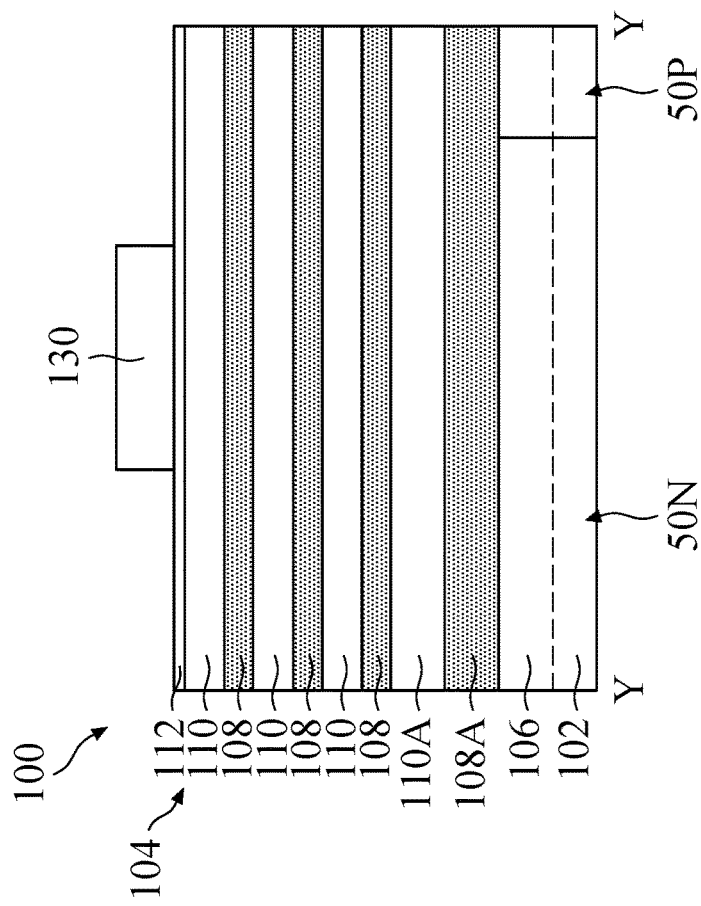

FIG. 1H-1 is a perspective view of a semiconductor structure 100 after the formation of source/drain features 126N and 126P and the removal of the dielectric walls 120, in accordance with some embodiments. FIG. 1H-2 and FIG. 1H-3 are cross-sectional views of the semiconductor structure 100 taken along Cross-section Y-Y and Cross-section X-X shown in FIG. 1H-1, in accordance with some embodiments.

Source/drain features 126N and 126P are formed in the source/drain trenches 122 using an epitaxial growth process, as shown in FIGS. 1H-1 and 1H-3, in accordance with some embodiments. The epitaxial growth process may be MBE, MOCVD, or VPE, another suitable technique, or a combination thereof. The source/drain features 126N and 126P abut on opposite sidewalls of the second semiconductor layers 110 and 110A of the fin structure 104, in accordance with some embodiments. The channel regions CH of the fin structure 104 are sandwiched between the source/drain features 126N and between the source/drain features 126P.

In some embodiments, the source/drain features 126N and the source/drain features 126P have different electrical conductivity types. The source/drain features 126N are n-type source/drain features and formed in the n-type well region 50N, and the source/drain features 126P are p-type source/drain features and formed in the p-type well region 50P, in accordance with some embodiments.

In some embodiments, the n-type source/drain features 126N and the p-type source/drain features 126P are formed separately. For example, a patterned mask layer (such as a photoresist layer and/or hard mask layer) may be formed to cover the semiconductor structure 100 in the p-type well region 50P, and then the n-type source/drain features 126N are grown. Afterward, the patterned mask layer may be removed.

Similarly, in some embodiments, a patterned mask layer (such as a photoresist layer and/or hard mask layer) is formed to cover the semiconductor structure 100 in the n-type well region 50N, and then the p-type source/drain features 126P are grown. Afterward, the patterned mask layer may be removed.

In some embodiments, the epitaxial material of the source/drain features 126N and 126P mainly grows from the semiconductor surface provided by the second semiconductor layers 110A and 110. In some embodiments, the epitaxial material growing on the dielectric surface provided by the isolation structure 114 has a slower growth rate, and thus voids 128 may be formed between the epitaxial material and the isolation structure 114. In alternative embodiments, the epitaxial material grows on the dielectric surface provided by the isolation structure 114, and thus there is no void between the epitaxial material and the isolation structure 114.

In addition, the epitaxial material does not grow on the dielectric surface provided by the mask layer 112, which may prevent the bridging between the epitaxial materials on the opposite sides of the fin structure 104, in accordance with some embodiments. In some embodiments, the upper surfaces of the source/drain features 126N and 126P are located between the top surface and the bottom surface of the mask layer 112.

In some embodiments, the lateral growth of the source/drain features 126N and 126P in the Y direction is confined by the dielectric walls 120, and thus may be formed with column profiles and narrow widths in the Y direction. The source/drain features 126N and 126P having a narrow width in the Y direction can reduce the parasitic capacitance between the gate stack and the source/drain feature, thereby enhancing the performance (e.g., speed) of the resulting semiconductor device.

In some embodiments, the source/drain features 126N and 126P are in-situ doped during the epitaxial processes. In some embodiments, the respective concentrations of the dopant in the source/drain features 126N and 126P are in a range from about $1 \times 10^{18}$ cm$^{-3}$ to about $1 \times 10^{22}$ cm$^{-3}$.

In some embodiments, the n-type source/drain features 126N are doped with the n-type dopant during the epitaxial growth process. For example, the n-type dopant may be phosphorous (P) or arsenic (As). For example, the n-type source/drain features 126N may be the epitaxially grown Si doped with phosphorous to form silicon:phosphor (Si:P) source/drain features and/or arsenic to form silicon:arsenic (Si:As) source/drain feature.

In some embodiments, the p-type source/drain features 126P are doped with the p-type dopant during the epitaxial growth process. For example, the p-type dopant may be boron (B) or $BF_2$. For example, the p-type source/drain features 126P may be the epitaxially grown SiGe doped with boron (B) to form silicon germanium:boron (SiGe:B) source/drain feature. In some embodiments, the n-type source/drain features 126N and the p-type source/drain features 126P are made of different materials. For example, the n-type source/drain features 126N are made of SiP, and the p-type source/drain features 126P are made of SiGe.

Mask layers 130 are formed on the top surfaces of the source/drain features 126N, as shown in FIGS. 1H-1, 1H-2 and 1H-3, in accordance with some embodiments. The mask layers 130 are made of dielectric material, such as silicon oxynitride (SiON), silicon nitride (SiN), silicon carbon nitride (SiCN), silicon oxycarbonitride (SiOCN), oxygen-doped silicon carbonitride (Si(O)CN), and/or silicon oxide (SiO$_2$). In some embodiments, the mask layer 130 and the isolation structure 114 are made of different materials and have a great difference in etching selectivity.

In some embodiments, the formation of the mask layers 130 includes depositing a dielectric material for the mask layer 130 to overfill the remainder of the trenches 122. In some embodiments, the dielectric material covers the top surfaces of the dielectric walls 120. In some embodiments, the deposition process includes CVD (such as FCVD, LPCVD, PECVD, HDP-CVD, or HARP), ALD, another suitable technique, and/or a combination thereof. In some embodiments, the formation of the mask layer 130 also includes planarizing the dielectric material until the dielectric walls 120 are exposed. The planarization process may be CMP, etching back process, or a combination thereof, in accordance with some embodiments.

Afterward, the dielectric walls 120 and the remaining portions of the lining layer 116 are removed using one or more etching processes, thereby exposing the gate regions GA of the fin structure 104 and the isolation structure 114, in accordance with some embodiments. In some embodiments, the etching process may be anisotropic etching process such as dry plasma etching, an isotropic etching process such as dry chemical etching, remote plasma etching or wet chemical etching, and/or a combination thereof. In some embodiments, the spaces defined between the fin structure 104 and the source/drain features 126N (and/or 126P) are referred to as spaces 132.

Figures 1, 1I:
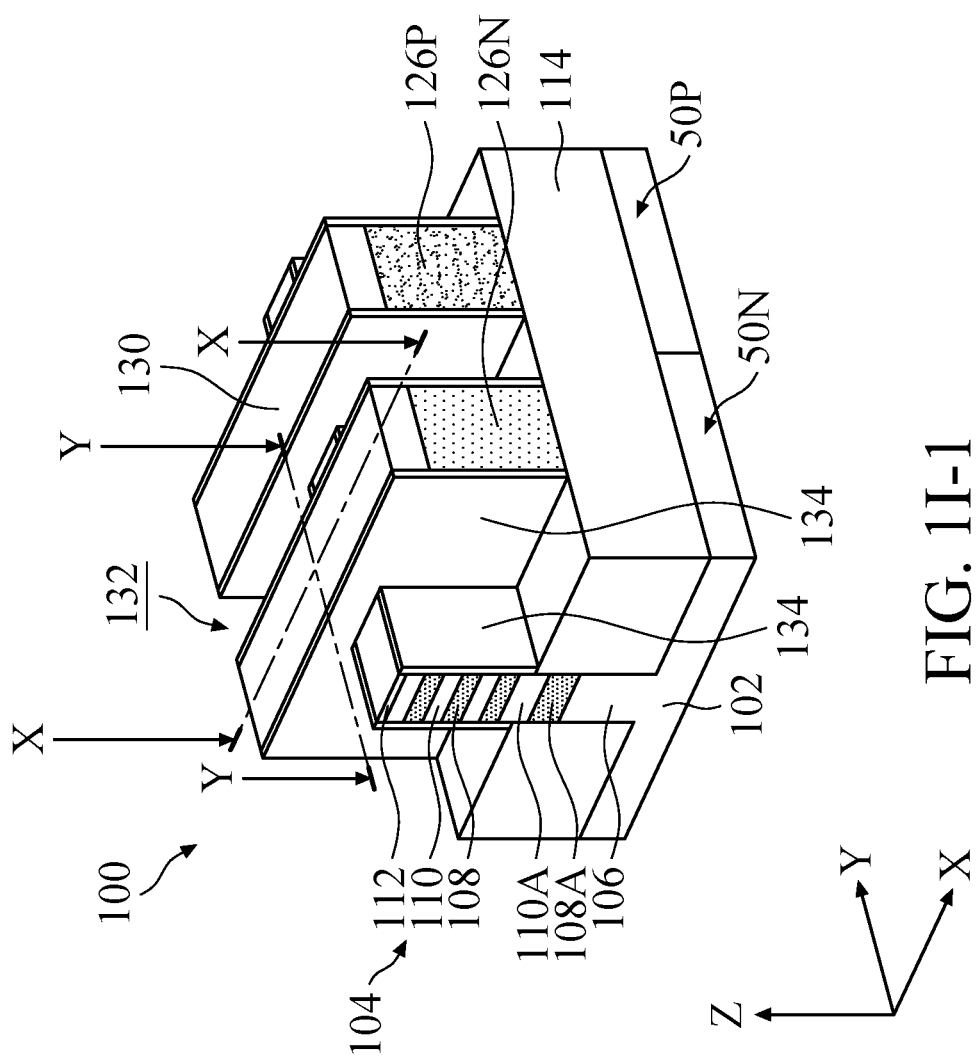
Figures 1, 1I, 2, 3:
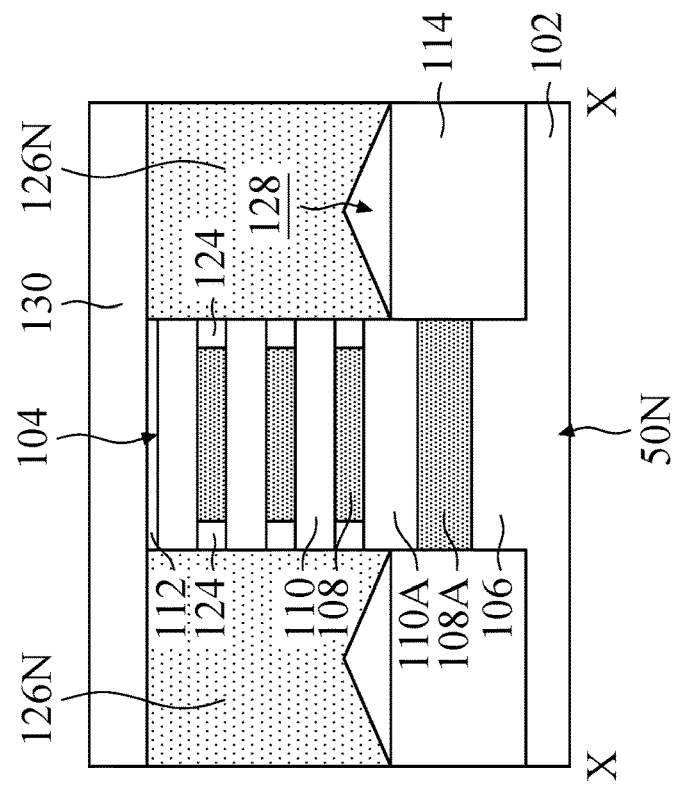
Figures 1, 1I, 2:
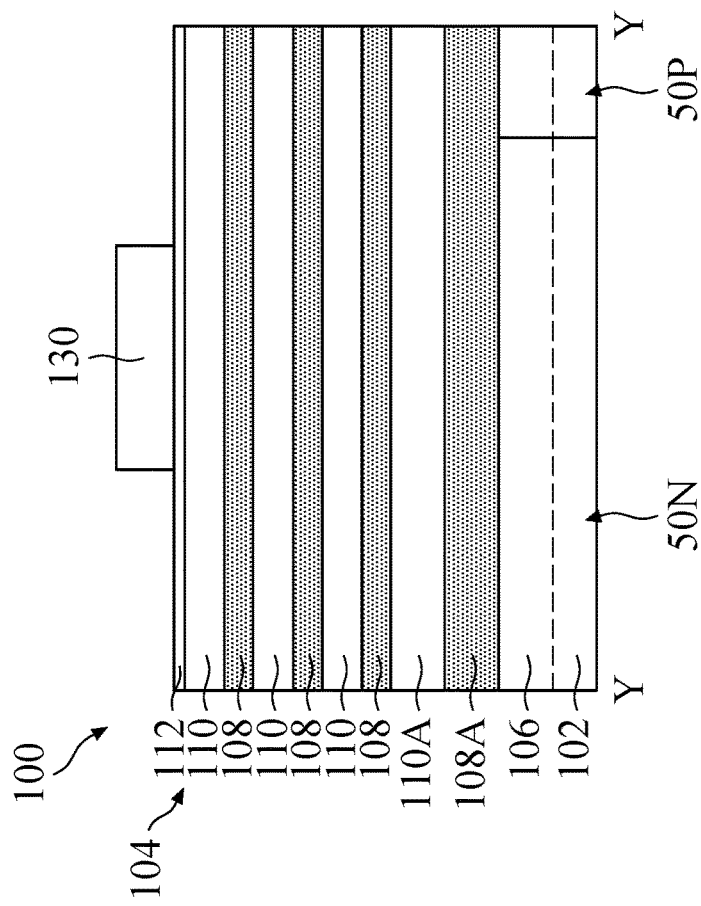

FIG. 1I-1 is a perspective view of a semiconductor structure 100 after the formation of spacer layers 134, in accordance with some embodiments. FIG. 1I-2 and FIG. 1I-3 are cross-sectional views of the semiconductor structure 100 taken along Cross-section Y-Y and Cross-section X-X shown in FIG. 1I-1, in accordance with some embodiments.

Spacer layer 134 is formed over the semiconductor structure 100 to cover the exposed surfaces of the fin structure 104 and the source/drain features 126N and 126P, as shown in FIGS. 1I-1 and 1I-3, in accordance with some embodiments. In some embodiments, the spacer layer 134 is made of dielectric material, such as silicon oxynitride (SiON), silicon nitride (SiN), silicon carbon nitride (SiCN), silicon oxycarbonitride (SiOCN), oxygen-doped silicon carbonitride (Si(O)CN), and/or silicon oxide (SiO$_2$). In some embodiments, the spacer layer 134 and the isolation structure 114 are made of different materials and have a great difference in etching selectivity.

In some embodiments, the formation of the spacer layer 134 includes globally and conformally depositing a dielectric material for the spacer layer 134 along the semiconductor structure 100, and etching the dielectric material to remove horizontal portions of the dielectric material along the upper surface of the fin structure 104, the upper surfaces of the source/drain features 126N and 126P, and the upper surface of isolation structure 114. The vertical portions of the dielectric material remaining on the sidewalls of the fin structure 104 and the sidewalls of the source/drain features 126N and 126P serve as the spacer layers 134, in accordance with some embodiments. In some embodiments, the upper portion of the sidewalls of the lowermost second semiconductor layer 110A are uncovered by the spacer layer 134.

Figures 1, 1J:
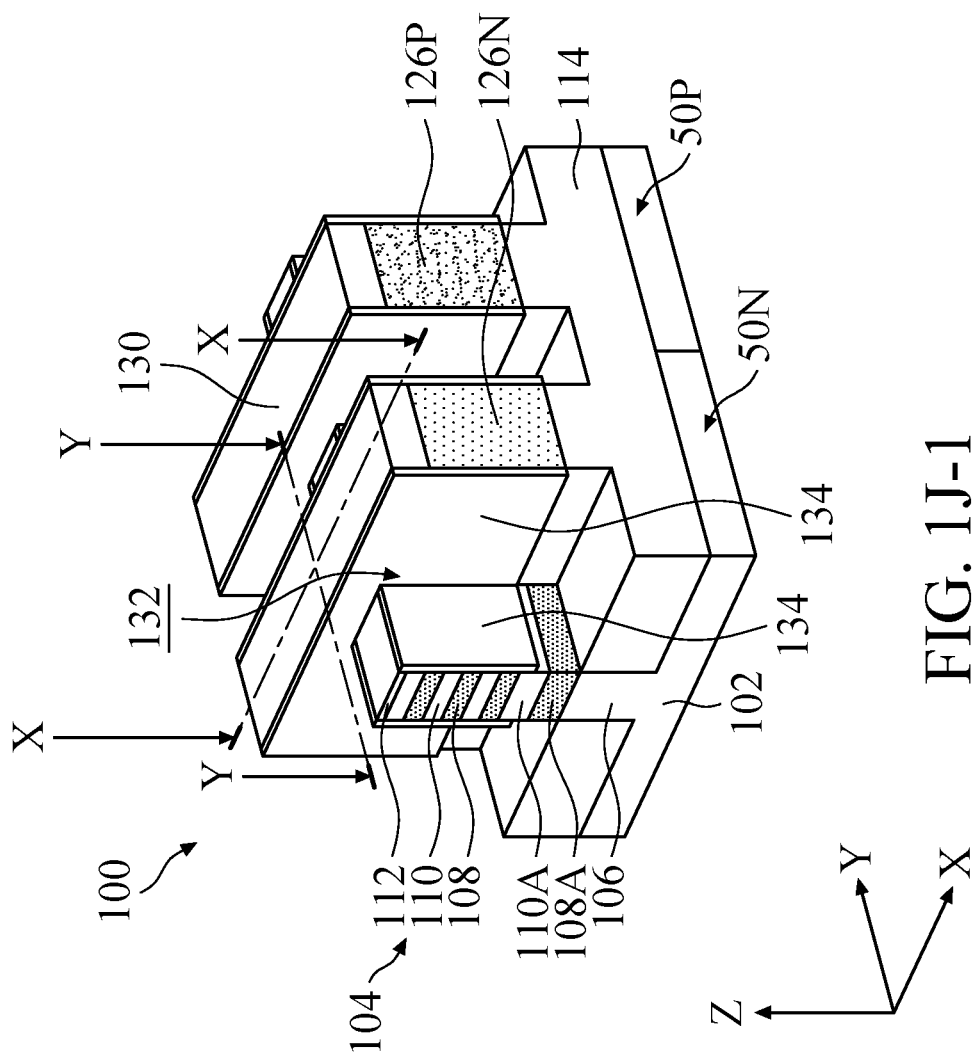
Figures 1, 1J, 2, 3:
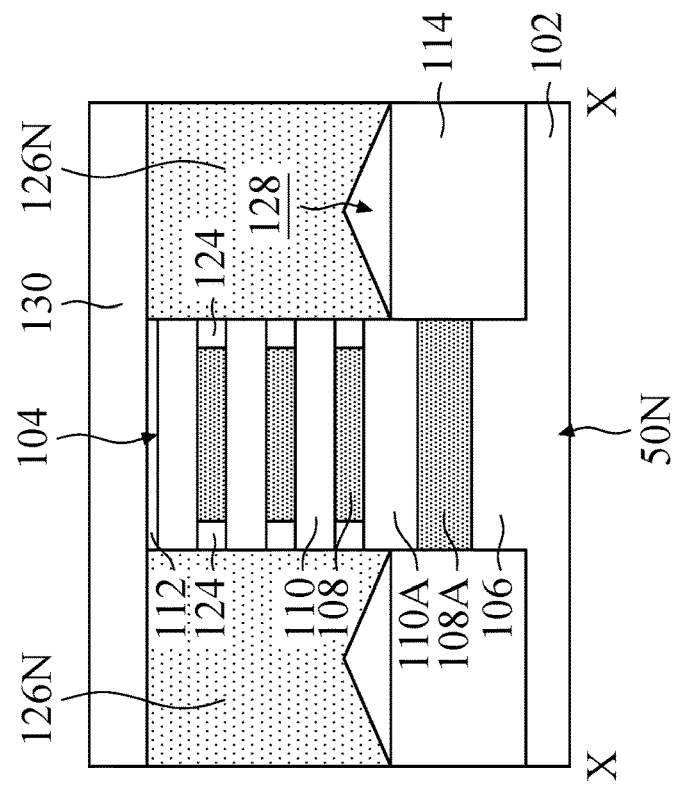
Figures 1, 1J, 2:
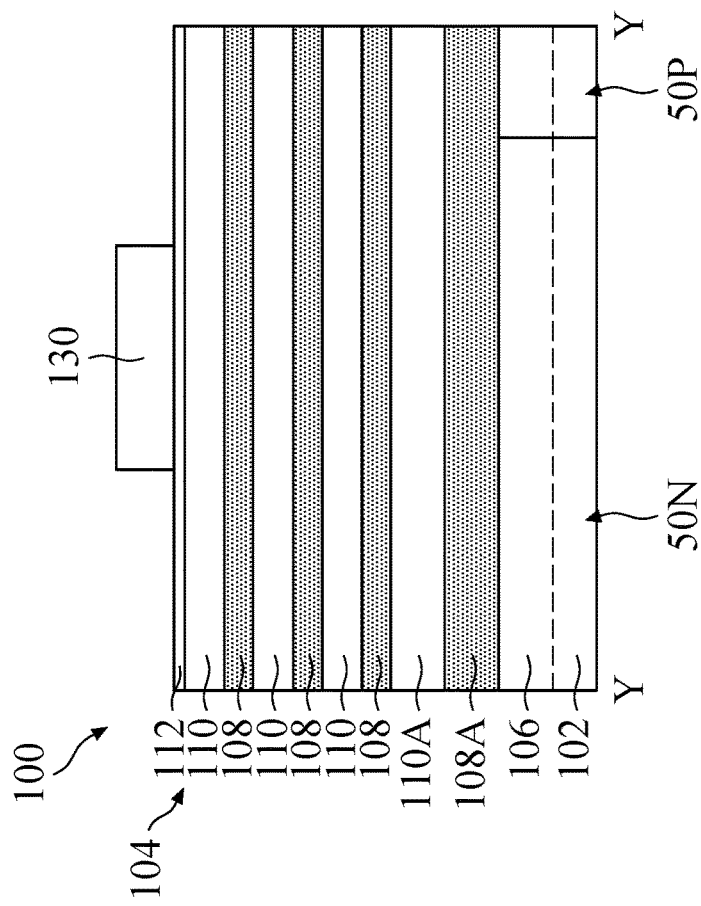

FIG. 1J-1 is a perspective view of a semiconductor structure 100 after an etching process, in accordance with some embodiments. FIG. 1J-2 and FIG. 1J-3 are cross-sectional views of the semiconductor structure 100 taken along Cross-section Y-Y and Cross-section X-X shown in FIG. 1J-1, in accordance with some embodiments.

An etching process is performed on the semiconductor structure 100 to vertically recess, from the spaces 132, the isolation structure 114 until the lowermost first semiconductor layer 108A of the fin structure 104 is exposed, as shown in FIG. 1J-1, in accordance with some embodiments. In some embodiments, the etching process is an isotropic etching such as wet chemical etching, dry chemical etching, remote plasma etching, another suitable technique, and/or a combination thereof.

During the etching process, the mask layers 112 and 130 and the spacer layer 134 protect the fin structure 104 and the source/drain features 126N and 126P from being damaged, in accordance with some embodiments. After the etching process, the top surface of the isolation structure 114 is located at a level substantially equal to or lower than the bottom surface of the lowermost first semiconductor layer 108A, in accordance with some embodiments.

Figures 1, 1K:
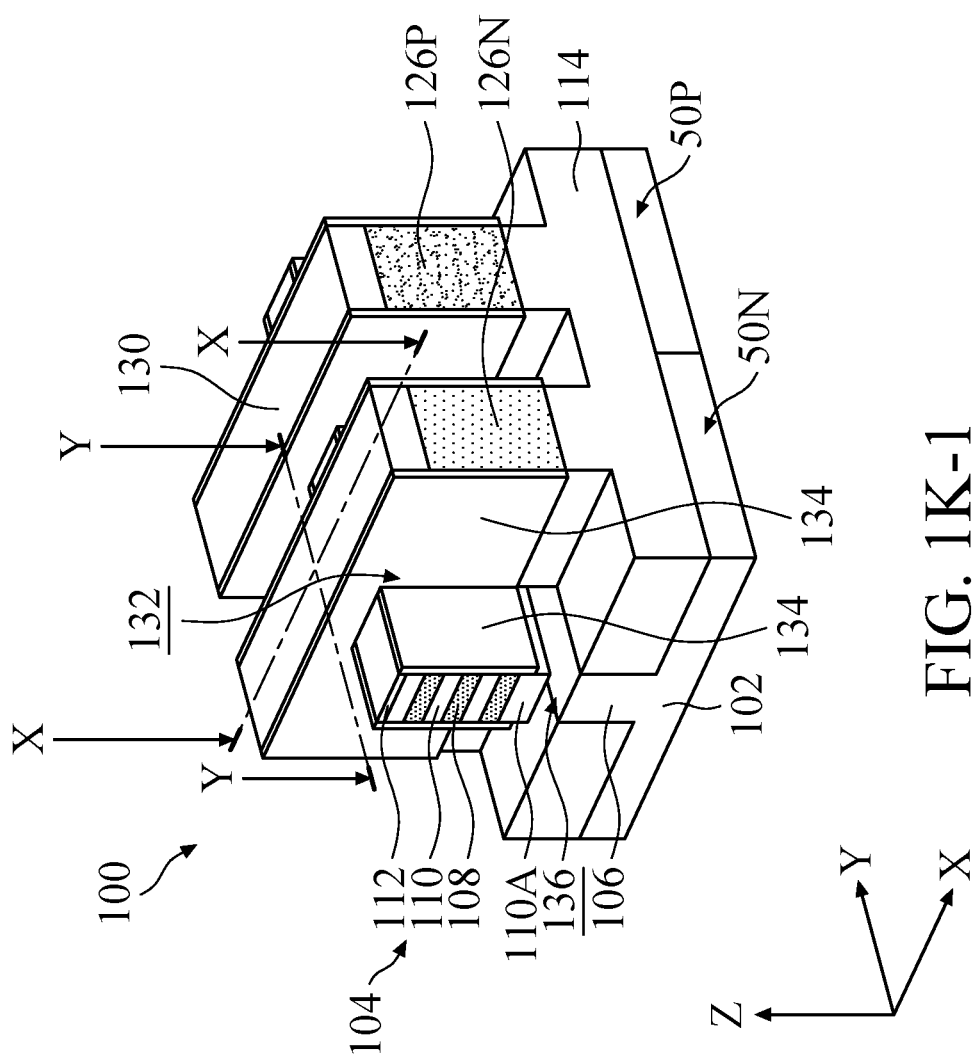
Figures 1, 1K, 2, 3:
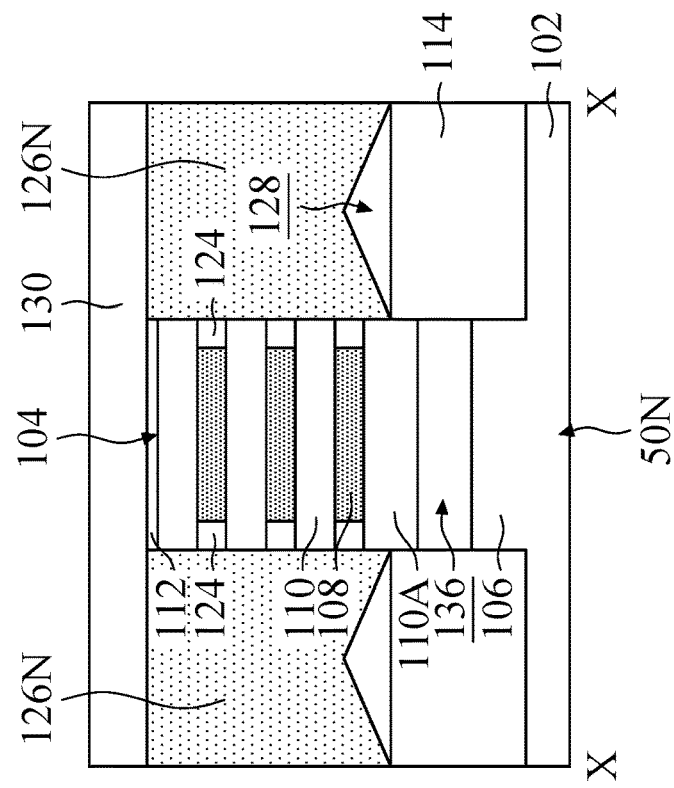
Figures 1, 1K, 2:
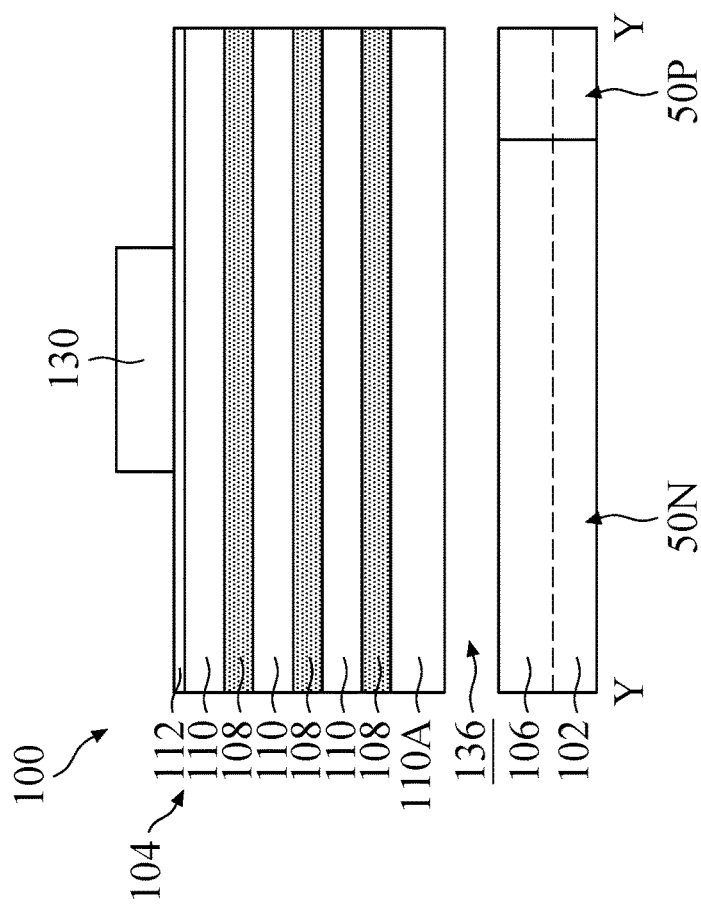

FIG. 1K-1 is a perspective view of a semiconductor structure 100 after the removal of the lowermost first semiconductor layer 108A, in accordance with some embodiments. FIG. 1K-2 and FIG. 1K-3 are cross-sectional views of the semiconductor structure 100 taken along Cross-section Y-Y and Cross-section X-X shown in FIG. 1K-1, in accordance with some embodiments.

An etching process is performed on the semiconductor structure 100 to remove, from the spaces 132, the lowermost first semiconductor layer 108A, thereby forming a gap 136, as shown in FIGS. 1K-1, 1K-2 and 1K-3, in accordance with some embodiments. In some embodiments, the etching process is an isotropic etching such as wet chemical etching, dry chemical etching, remote plasma etching, another suitable technique, and/or a combination thereof. During the etching process, the mask layers 112 and 130 and the spacer layer 134 protect the fin structure 104 and the source/drain features 126N and 126P from being damaged, in accordance with some embodiments.

Figures 1, 1L:
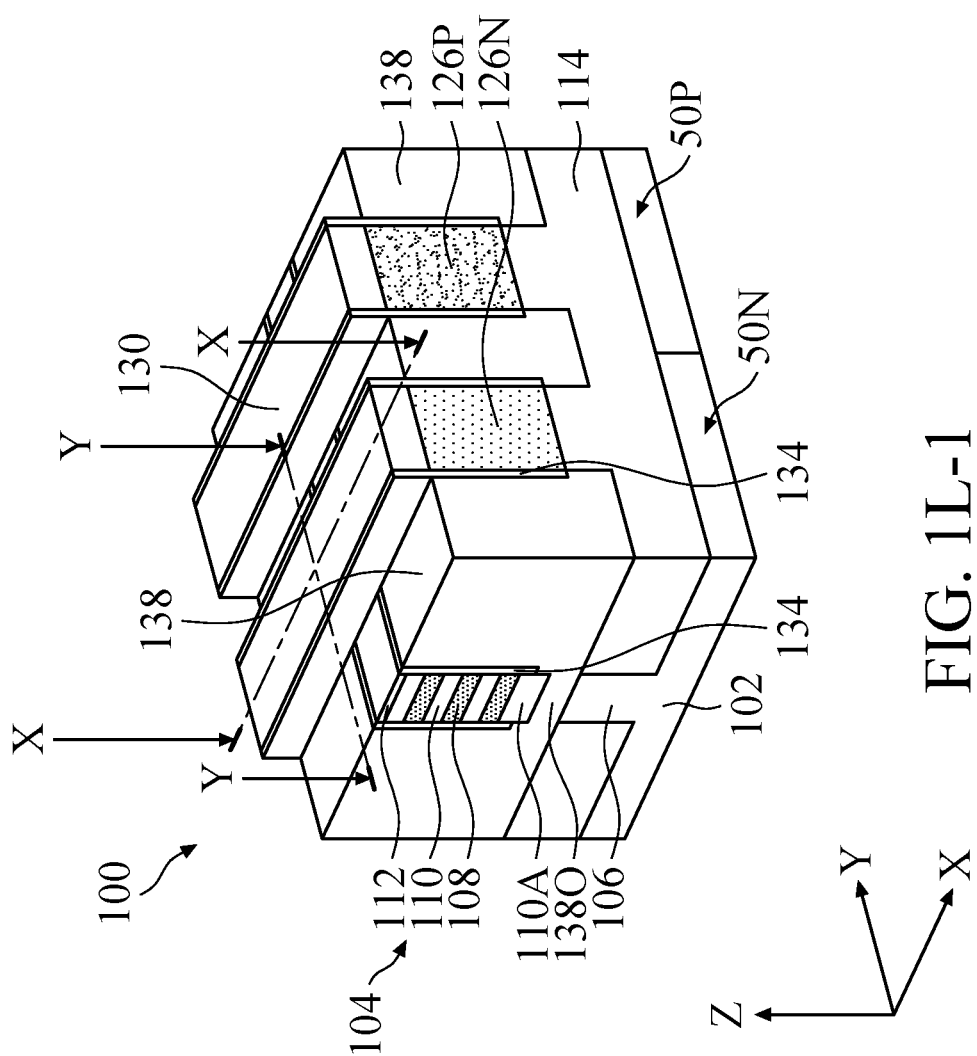
Figures 1, 1L, 2, 3:
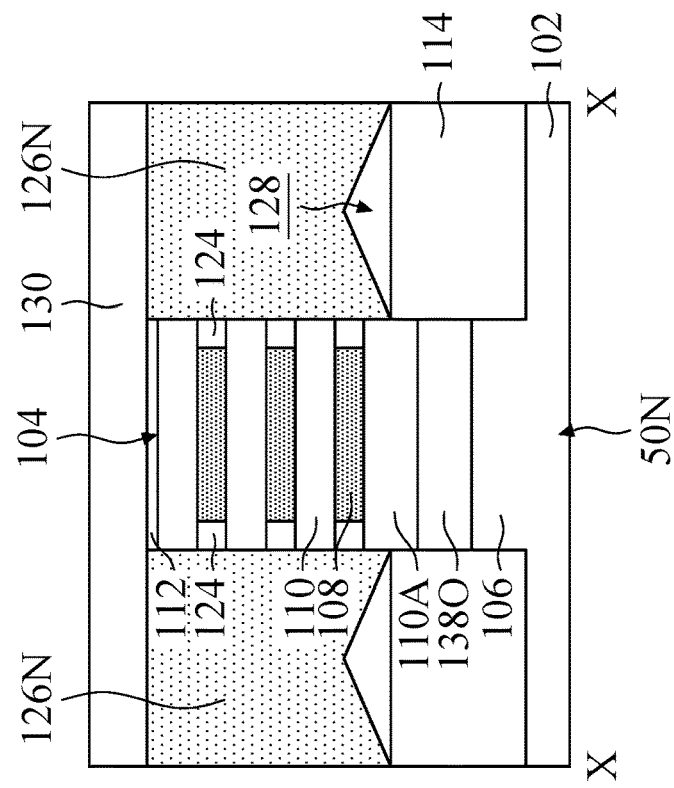
Figures 1, 1L, 2:
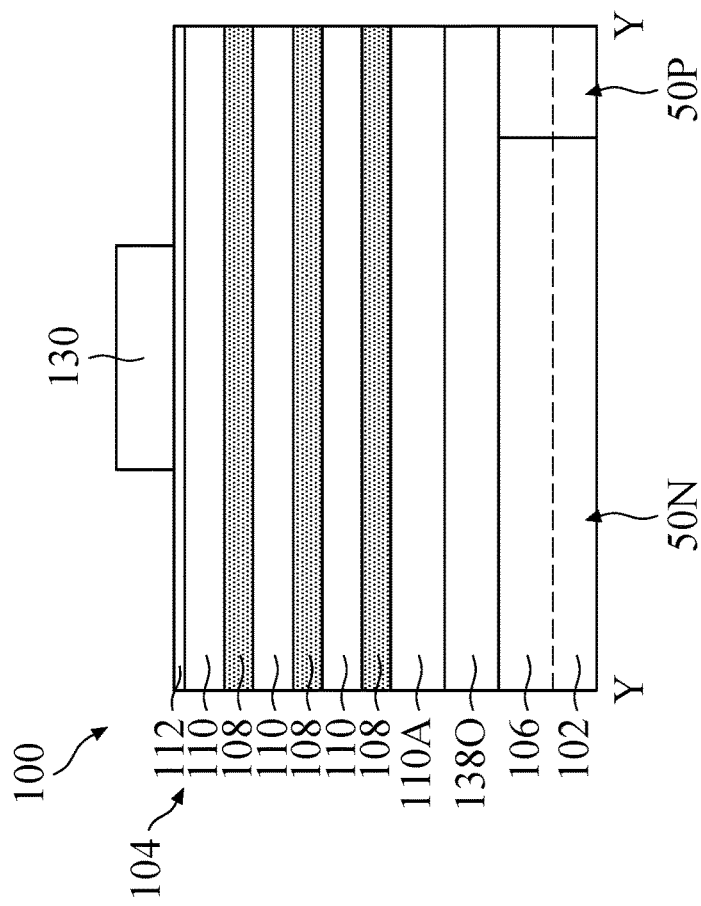

FIG. 1L-1 is a perspective view of a semiconductor structure 100 after the formation of a lower interlayer dielectric layer 138, in accordance with some embodiments. FIG. 1L-2 and FIG. 1L-3 are cross-sectional views of the semiconductor structure 100 taken along Cross-section Y-Y and Cross-section X-X shown in FIG. 1L-1, in accordance with some embodiments.

A lower interlayer dielectric layer 138 is formed over the semiconductor structure 100, as shown in FIGS. 1L-1, 1L-2 and 1L-3, in accordance with some embodiments. The lower interlayer dielectric layer 138 fills the gap 136, in accordance with some embodiments. The portion of the lower interlayer dielectric layer 138 filling the gap 136 is denoted as 138O and serves as a gate dielectric layer (e.g., gate oxide) for an input/output transistor, in accordance with some embodiments.

In some embodiments, the lower interlayer dielectric layer 138 is made of silicon-oxide based material such as silicon oxide (SiO$_2$), silicon oxynitride (SiON), oxygen-doped silicon carbide (SiC:O), oxygen-doped silicon carbonitride (Si(O)CN), or a combination thereof. In some embodiments, the lower interlayer dielectric layer 138 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the lower interlayer dielectric layer 138 and the mask layer 112 are made of different materials and have a great difference in etching selectivity.

In some embodiments, the formation of the lower interlayer dielectric layer 138 includes depositing a dielectric material for the lower interlayer dielectric layer 138 to overfill the spaces 132 and the gap 136. The dielectric material is formed over the top surfaces of the mask layers 130, in accordance with some embodiments. In some embodiments, the dielectric material is deposited using CVD (such as FCVD, LPCVD, PECVD, HDP-CVD, or HARP), ALD, another suitable technique, and/or a combination thereof.

The dielectric material over the top surfaces of the mask layers 130 is planarized to expose the top surfaces of the mask layers 130, for example, using CMP, etching back process, or a combination thereof, in accordance with some embodiments. The dielectric material is further recessed until the top surface of the mask layer 112 is exposed, in accordance with some embodiments. The recessing process may be an anisotropic etching process such as dry plasma etching, an isotropic etching process such as dry chemical etching, remote plasma etching or wet chemical etching, and/or a combination thereof. A remainder of the dielectric material serves as the lower interlayer dielectric layer 138, in accordance with some embodiments. In some embodiments, the lower interlayer dielectric layer 138 has a top surface that is substantially leveled with the top surface of the mask layer 112.

Figures 1, 1M:
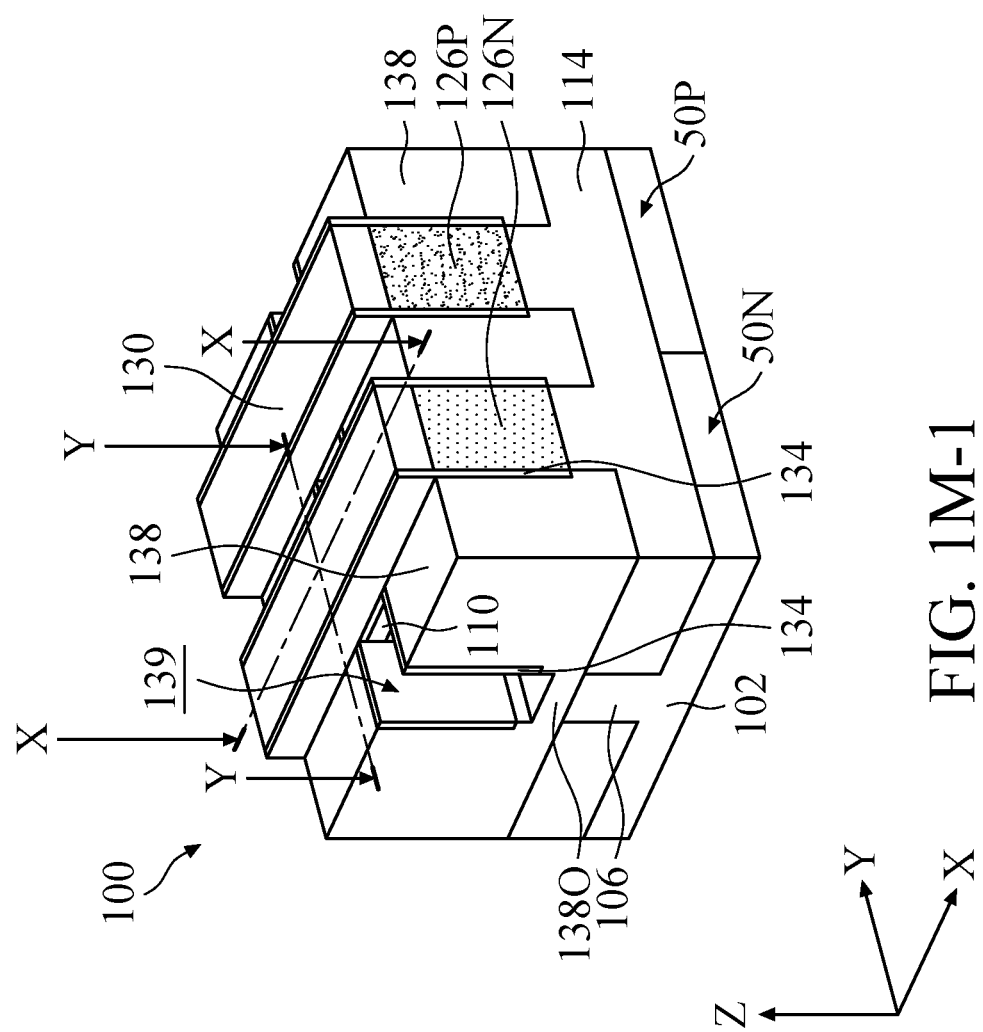
Figures 1, 1M, 2, 3:
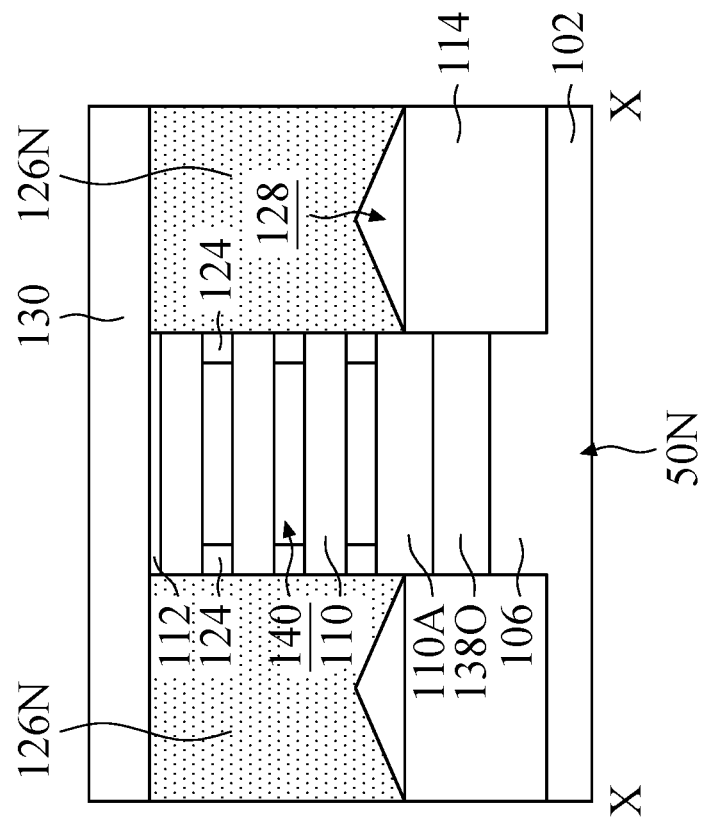
Figures 1, 1M, 2:
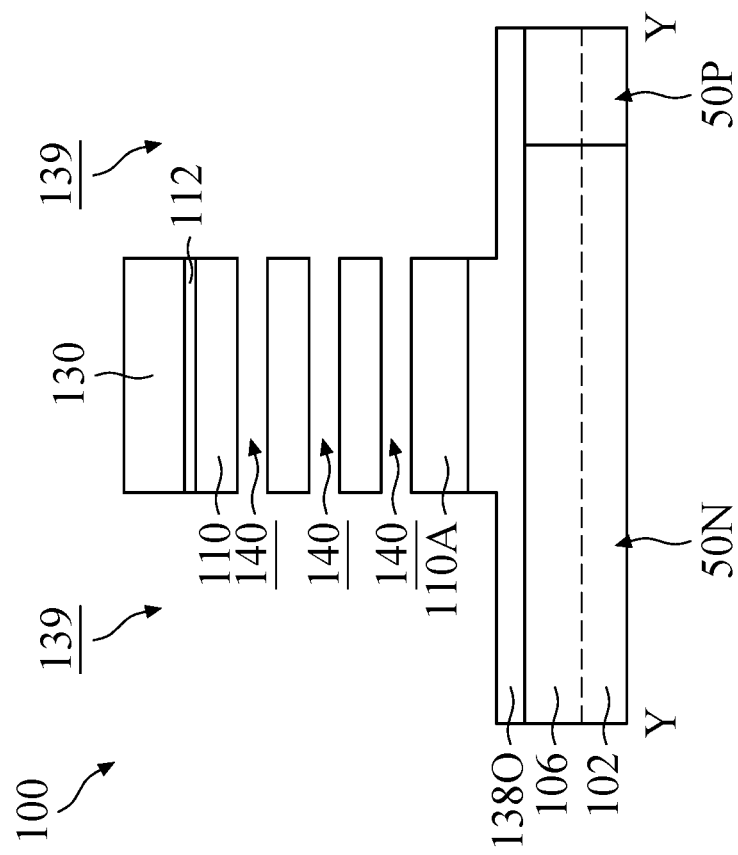

FIG. 1M-1 is a perspective view of a semiconductor structure 100 after the formation of gate recesses 139 and gaps 140, in accordance with some embodiments. FIG. 1M-2 and FIG. 1M-3 are cross-sectional views of the semiconductor structure 100 taken along Cross-section Y-Y and Cross-section X-X shown in FIG. 1M-1, in accordance with some embodiments.

One or more etching processes are performed on the semiconductor structure 100 using the mask layers 130 as an etch mask to cut through the fin structure 104, in accordance with some embodiments. The portions of the mask layer 112 and the gate regions GA of the fin structure 104, uncovered by the mask layers 130, are removed to form gate recesses 139 until the gate dielectric layer 138O is exposed, as shown in FIGS. 1M-1 and 1M-2, in accordance with some embodiments.

In some embodiments, the one or more etching processes are an anisotropic etching process, e.g., dry plasma etching, or an isotropic etching such as wet chemical etching, dry chemical etching, remote plasma etching, another suitable technique, and/or a combination thereof. In some embodiments, the one or more etching processes include an over-etching step to recess the gate dielectric layer 138O. As a result, the top surface of the gate dielectric layer 138O exposed from the gate recess 139 is located at a lower level than the top surface of the gate dielectric layer 138O covered by the lowermost second semiconductor layer 110A, as shown in FIG. 1M-2.

Afterward, an etching process is performed to remove, from the gate recesses 139, the first semiconductor layers 108 of the fin structure 104 to form gaps 140, as shown in FIGS. 1M-2 and 1M-3, in accordance with some embodiments. The inner spacer layers 124 may be used as an etching stop layer in the etching process and protect the source/drain features 126N and 126P from being damaged, in accordance with some embodiments.

In some embodiments, the etching process is an isotropic etching such as wet chemical etching, dry chemical etching, remote plasma etching, another suitable technique, and/or a combination thereof. For example, the etching process includes a selective wet etching process, such as APM (e.g., ammonia hydroxide-hydrogen peroxide-water mixture) etching process. In some embodiments, the wet etching process uses etchants such as ammonium hydroxide (NH$_4$OH), TMAH, ethylenediamine pyrocatechol (EDP), and/or potassium hydroxide (KOH) solutions.

The gate recesses 139 expose the sidewalls of the second semiconductor layer 110A and 110, in accordance with some embodiments. The gaps 140 expose the bottom surface of the topmost second semiconductor layer 110, the top surface of the lowermost second semiconductor layer 110A, and the top and bottom surfaces of the second topmost and third topmost second semiconductor layers 110, in accordance with some embodiments. The top surface of the topmost second semiconductor layer 110 remained covered by the mask layer 112, and the bottom surface of the lowermost second semiconductor layer 110A remained covered by the gate dielectric layer 138O, in accordance with some embodiments. In some embodiments, the gaps 140 also expose the sidewalls of the inner spacer layers 124 facing the channel regions CH.

After the etching processes, at least three main surfaces of the second semiconductor layers 110A and 110 are exposed, and the exposed second semiconductor layers 110A and 110 form nanostructures that function as channel layers of the resulting semiconductor devices, in accordance with some embodiments.

Figures 1, 1N:
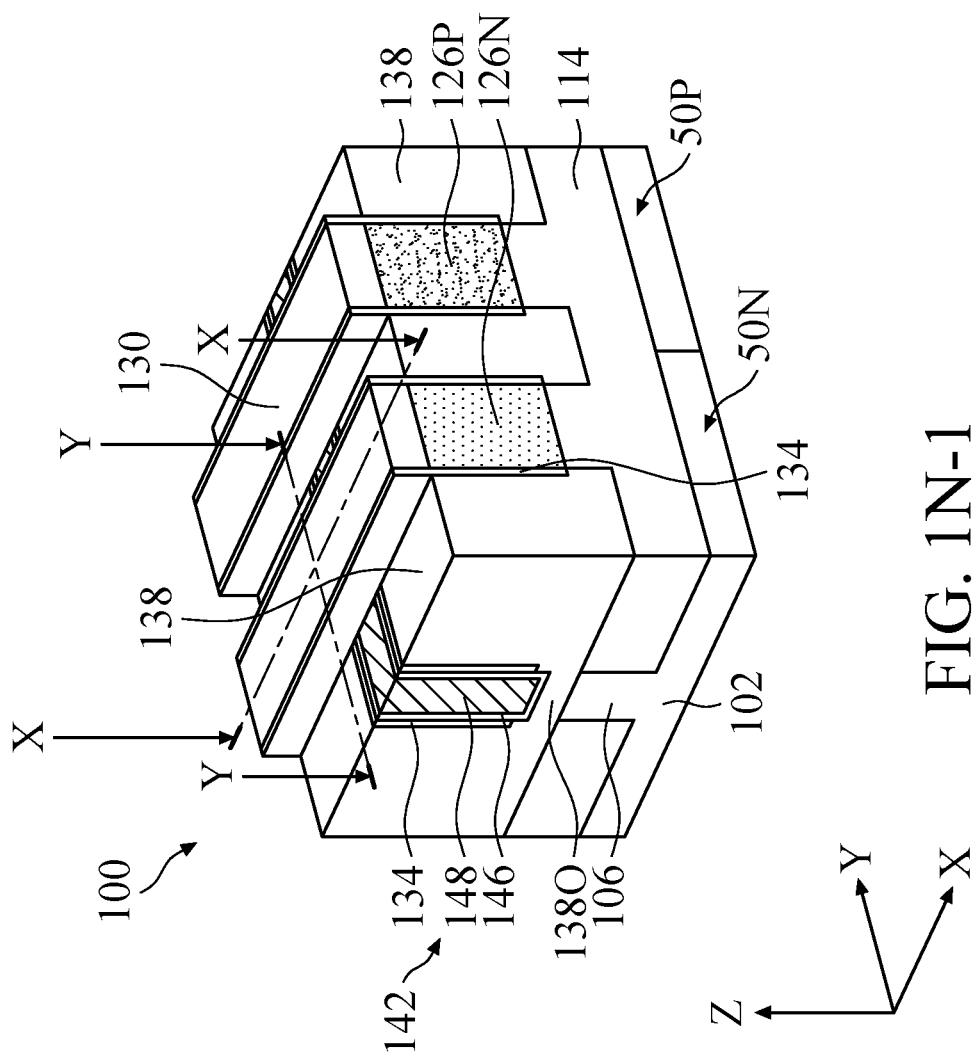
Figures 1, 1N, 2, 3:
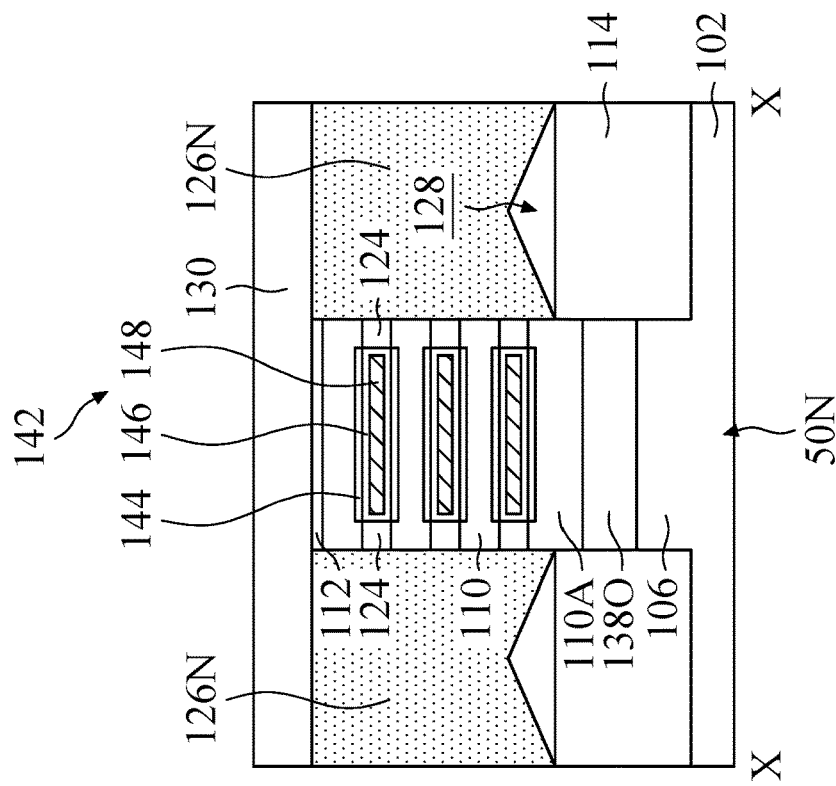
Figures 1, 1N, 2:
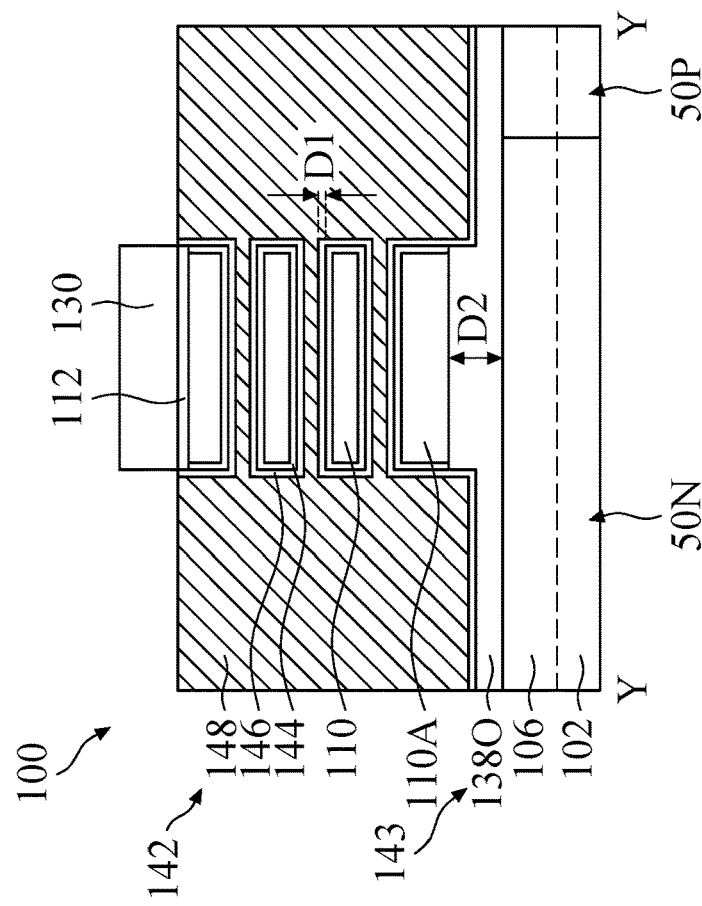

FIG. 1N-1 is a perspective view of a semiconductor structure 100 after the formation of a gate stack 142, in accordance with some embodiments. FIG. 1N-2 and FIG. 1N-3 are cross-sectional views of the semiconductor structure 100 taken along Cross-section Y-Y and Cross-section X-X shown in FIG. 1N-1, in accordance with some embodiments.

An interfacial layer 144 is formed on the exposed surfaces of the nanostructures 110A and 110, as shown in FIGS. 1N-2 and 1N-3, in accordance with some embodiments. The interfacial layer 144 partially wraps around the topmost nanostructure 110 and lowermost nanostructure 110A (by three sides), and entirely wraps around the other nanostructures 110 (by four sides), in accordance with some embodiments.

In some embodiments, the interfacial layer 144 is made of a chemically formed silicon oxide. In some embodiments, the interfacial layer 144 is formed using one or more cleaning processes such as including ozone (O3), ammonia hydroxide-hydrogen peroxide-water mixture, and/or hydrochloric acid-hydrogen peroxide-water mixture. Semiconductor material from the nanostructures 110 is oxidized to form the interfacial layer 144, in accordance with some embodiments.

A gate dielectric layer 146 is formed conformally along the interfacial layer 144 to partially wraps around the topmost nanostructure 110 and lowermost nanostructure 110A and entirely wraps around the other nanostructures 110, as shown in FIGS. 1N-1, 1N-2 and 1N-3, in accordance with some embodiments. The gate dielectric layer 146 is also conformally formed along the top surface of the gate dielectric layer 138O, in accordance with some embodiments. The gate dielectric layer 146 is also conformally formed along the sidewalls of the inner spacer layers 124 facing the channel regions CH, in accordance with some embodiments.

The gate dielectric layer 146 may be a high-k dielectric layer. In some embodiments, the high-k dielectric layer is made of a dielectric material with a high dielectric constant (k-value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, physical vapor deposition (PVD), CVD, and/or another suitable technique.

In some embodiments, the gate dielectric layer 146 is made of a different material than the gate dielectric layer 138O and has a higher k-value than the gate dielectric layer 138O. For example, the gate dielectric layer 146 is a hafnium-containing dielectric layer (such as $HfO_2$), and the gate dielectric layer 138O is a SiO layer.

In some embodiments, the gate dielectric layer 146 is thinner than the gate dielectric layer 138O. In some embodiments, the gate dielectric layer 146 has a thickness D1 in a range from about 0.5 nm to about 2.0 nm. In some embodiments, the gate dielectric layer 138O has a thickness D2 in a range from about 3 nm to about 10 nm. In some embodiments, the ratio of the D1 to D2 (D1/D2) is in a range from about 0.2 to about 0.7.

A metal gate electrode layer 148 is formed over the gate dielectric layer 146 and overfills remainders of the gate recesses 139 and the gaps 140, as shown in FIGS. 1N-1, 1N-2 and 1N-3, in accordance with some embodiments. The metal gate electrode layer 148 partially wraps around the topmost nanostructure 110 and lowermost nanostructure 110A and entirely wraps around the other nanostructures 110, in accordance with some embodiments.

In some embodiments, the metal gate electrode layer 148 is made of more than one conductive material, such as a metal, metal alloy, conductive metal oxide and/or metal nitride, another suitable conductive material, and/or a combination thereof. For example, the metal gate electrode layer 148 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 148 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 148 may be formed using ALD, PVD, CVD, e-beam evaporation, or another suitable process.

In some embodiments, the metal gate electrode layer 148 extends continuously through both the n-type well region 50N and the p-type well region 50P. In alternative embodiments, the metal gate electrode layer 148 may be formed separately in the n-type well region 50N and in the p-type well region 50P, where different work function materials are used.

A planarization process such as CMP may be performed on the semiconductor structure 100 to remove the materials of the gate dielectric layer 146 and the metal gate electrode layer 148 formed above the top surfaces of the mask layers 130 until the top surfaces of the mask layers 130 is exposed, in accordance with some embodiments.

Afterward, the materials of the gate dielectric layer 146 and the metal gate electrode layer 148 are further recessed until the top surface of the lower interlayer dielectric layer 138 is exposed, as shown in FIGS. 1N-1, in accordance with some embodiments. The recessing process may be an anisotropic etching process such as dry plasma etching, an isotropic etching process such as dry chemical etching, remote plasma etching or wet chemical etching, and/or a combination thereof.

The interfacial layer 144, the gate dielectric layer 146 and the metal gate electrode layer 148 combine to form a gate stack 142, in accordance with some embodiments. In some embodiments, the gate stack 142 extends in the Y direction. That is, the gate stack 142 has a longitudinal axis parallel to the Y direction, in accordance with some embodiments. The gate stack 142 surrounds each of the nanostructures 110A and 110 and is interposed between the n-type source/drain features 126N and between the p-type source/drain features 126P, in accordance with some embodiments.

The portion of the gate stack 142 in the n-type well region 50N combines with the n-type source/drain features 126N to form an n-channel nanostructure transistor, in accordance with some embodiments. The portion of the gate stack 142 in the p-type well region 50P combines with the p-type source/drain features 126P to form a p-channel nanostructure transistor, in accordance with some embodiments. In some embodiments, the n-channel nanostructure transistor and the p-channel nanostructure transistor which include the gate stack 142 are used for core transistors.

Furthermore, the heavily-doped lower fin element 106 is configured as a gate electrode layer (e.g., a silicon gate) and combines with the gate dielectric layer 138O to form a gate structure 143. In some embodiments, the gate structure 143 extends in the Y direction. That is, the gate structure 143 has a longitudinal axis parallel to the Y direction, in accordance with some embodiments. The gate structure 143 is aligned below the gate stack 142, in accordance with some embodiments. The gate structure 143 is located below the lowermost nanostructure 110A and is located between the n-type source/drain features 126N and between the p-type source/drain features 126P, in accordance with some embodiments.

The portion of gate structure 143 in the n-type well region 50N combines with the n-type source/drain features 126N to form an n-channel nanostructure transistor, in accordance with some embodiments. The portion of gate structure 143 in the p-type well region 50P combines with the p-type source/drain features 126P to form a p-channel nanostructure transistor, in accordance with some embodiments. In some embodiments, the n-channel nanostructure transistor and the p-channel nanostructure transistor which include the gate structure 143 are used for input/output transistors.

After the etching process for cutting through the first structure 104, dangling bonds may exist on the exposed etching surfaces of the first semiconductor layers 108 (e.g., SiGe) of the fin structure 104. The dangling bonds of the first semiconductor layers 108 have high reactivity. When the semiconductor structure is subjected to thermal processes (such as deposition processes and/or annealing processes), the first semiconductor layers 108 may be easily oxidized from the exposed etched surface where dangling bonds exist, especially if the residues, polymers and/or etching byproducts remain on the exposed etched surface of the first semiconductor layers 108. The oxide of the first semiconductor layers 108 (e.g., $GeO_x$) may provide a path for germanium atoms from the first semiconductor layers 108 to easily diffuse into the second semiconductor layers 110A and 110, which may increase the density of interface trap (Dit). As a result, the scattering of carriers (e.g., electrons and/or holes) may increase, and thus the carrier mobility may degrade.

In accordance with some embodiments, the cutting process of the fin structure 104 for forming gate recesses 139 (FIGS. 1O-1 through 1O-3) is performed late in the FEOL process. Furthermore, the removal of the first semiconductor layers 108 and the formation of the gate stack 142 are performed immediately after the cutting process of the fin structure 104, the risk of the formation of the diffusion path for germanium atoms may be substantially decreased. Therefore, Dit may be reduced, which may in turn improve the performance of the resulting semiconductor device.

Figures 1, 1O:
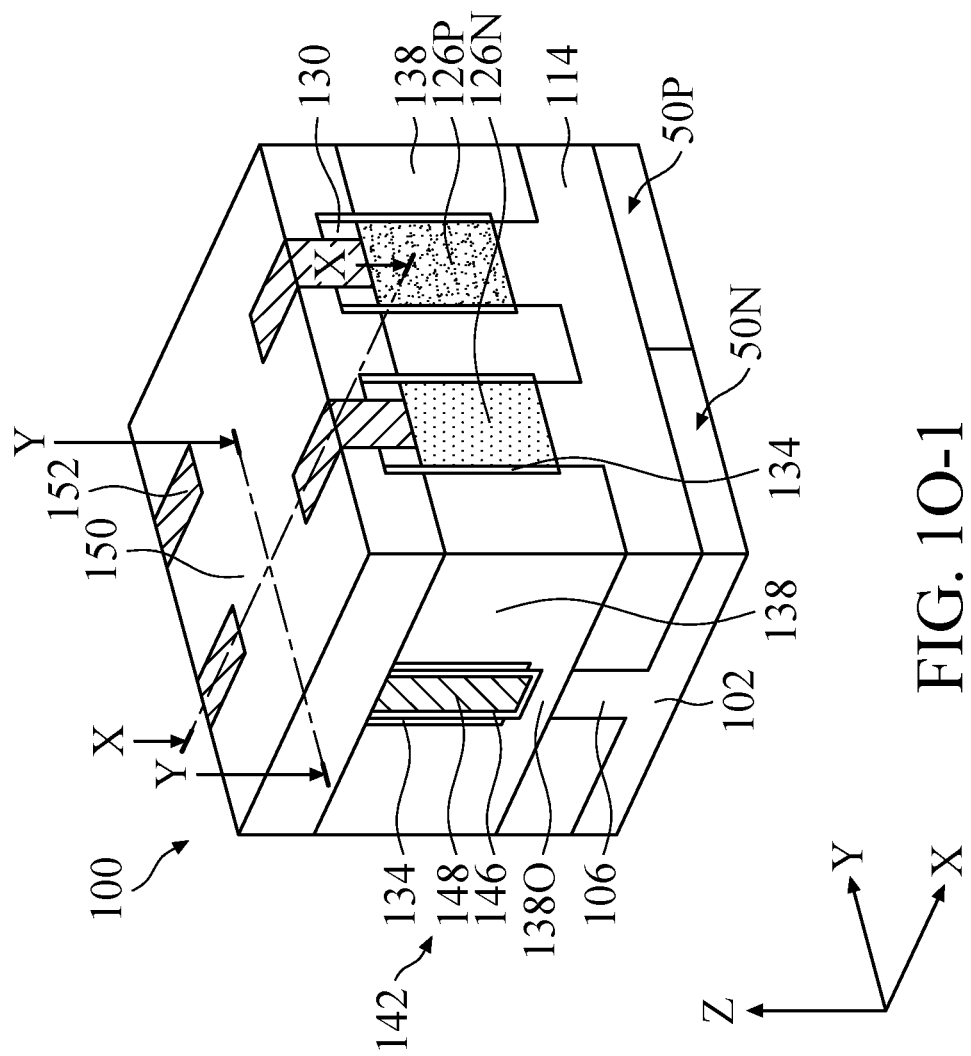
Figures 3, 10:
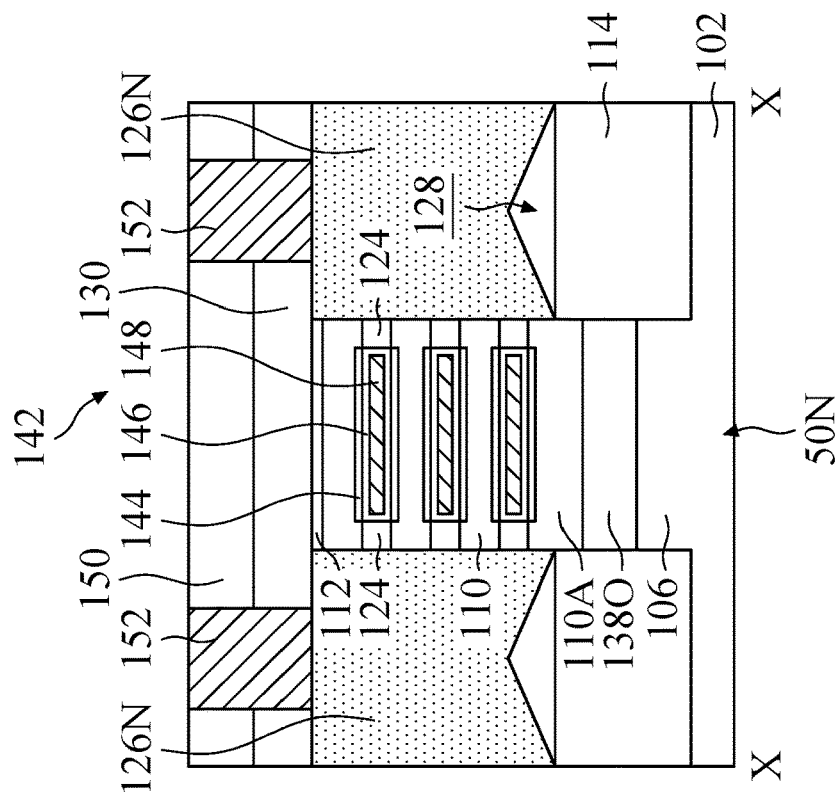
Figures 2, 10:
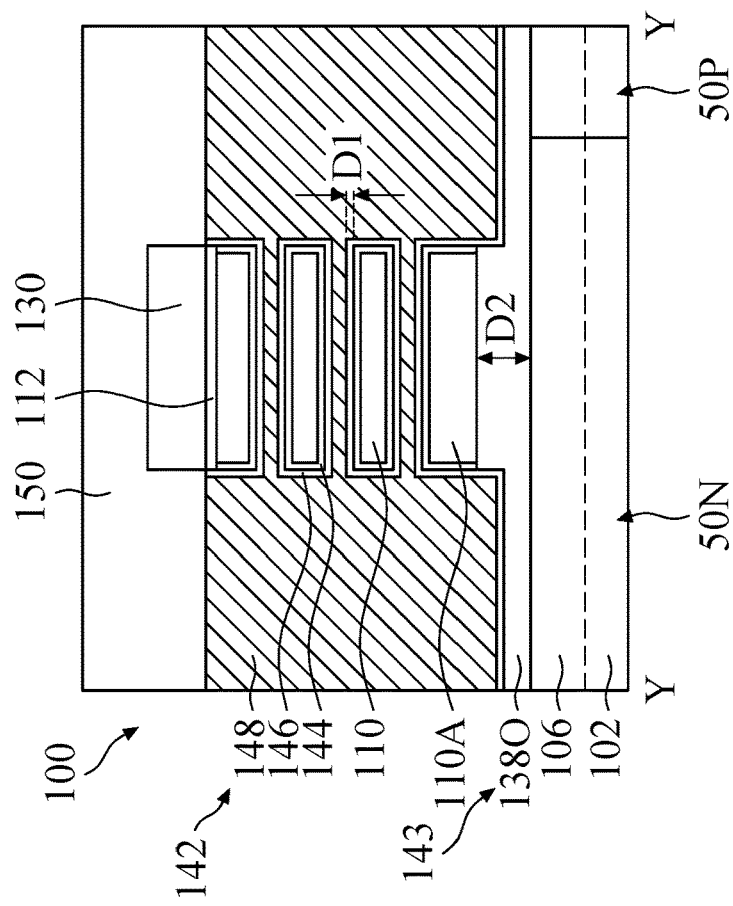

FIG. 1O-1 is a perspective view of a semiconductor structure 100 after the formation of contact plugs 152, in accordance with some embodiments. FIG. 1O-2 and FIG. 1O-3 are cross-sectional views of the semiconductor structure 100 taken along Cross-section Y-Y and Cross-section X-X shown in FIG. 1O-1, in accordance with some embodiments.

An upper interlayer dielectric layer 150 is formed over the semiconductor structure 100, as shown in FIGS. 1O-1, 1O-2 and 1O-3, in accordance with some embodiments. The upper interlayer dielectric layer 150 covers the gate stack 142 and the mask layers 130, in accordance with some embodiments.

In some embodiments, the upper interlayer dielectric layer 150 is made of dielectric material such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the upper interlayer dielectric layer 150 is made of un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the 1 upper interlayer dielectric layer 150 and the mask layer 112 are made of different materials and have a great difference in etching selectivity.

In some embodiments, the formation of the upper interlayer dielectric layer 150 includes depositing a dielectric material for the upper interlayer dielectric layer 150 using CVD (such as FCVD, LPCVD, PECVD, HDP-CVD, or HARP), ALD, another suitable technique, and/or a combination thereof.

Contact plugs 152 are formed in and/or through the upper interlayer dielectric layer 150 and the mask layers 130 and land on the source/drain features 126N and 126P, as shown in FIGS. 1O-1 and 1O-3, in accordance with some embodiments. The contact plugs 152 are electrically connected to the source/drain features 126N and 126P, in accordance with some embodiments. The contact plugs 152 may be also referred to as source/drain contact or Metal Diffusion (MD) features.

In some embodiments, the formation of the contact plugs 152 includes patterning the upper interlayer dielectric layer 150 and the mask layers 130 to form contact openings (where the contact plugs 152 are to be formed) exposing the source/drain features 126N and 126P using photolithography and etching processes, forming a silicide layer (such as WSi, NiSi, TiSi and/or CoSi) on the exposed source/drain features 126N and 126P, depositing one or more conductive materials for the contact plugs 152 to fill the contact openings, and planarizing the one or more conductive materials over the top surface of the upper interlayer dielectric layer 150 using, for example, CMP. In some embodiments, the conductive material is deposited using CVD, PVD, e-beam evaporation, ALD, electroplating (ECP), electroless deposition (ELD), another suitable method, or a combination thereof. After the planarization process, the top surfaces of the contact plugs 152 and the top surface of the upper interlayer dielectric layer 150 are substantially coplanar, in accordance with some embodiments.

The contact plugs 152 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the contact openings. The barrier layer is used to prevent the metal from the subsequently formed metal material from diffusing into the dielectric material (e.g., the upper interlayer dielectric layer 150). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the contact openings, and on the barrier layer (if formed). The glue layer is used to improve adhesion between the subsequently formed metal material and the dielectric material (e.g., the upper interlayer dielectric layer 150). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

Figures 1, 1P:
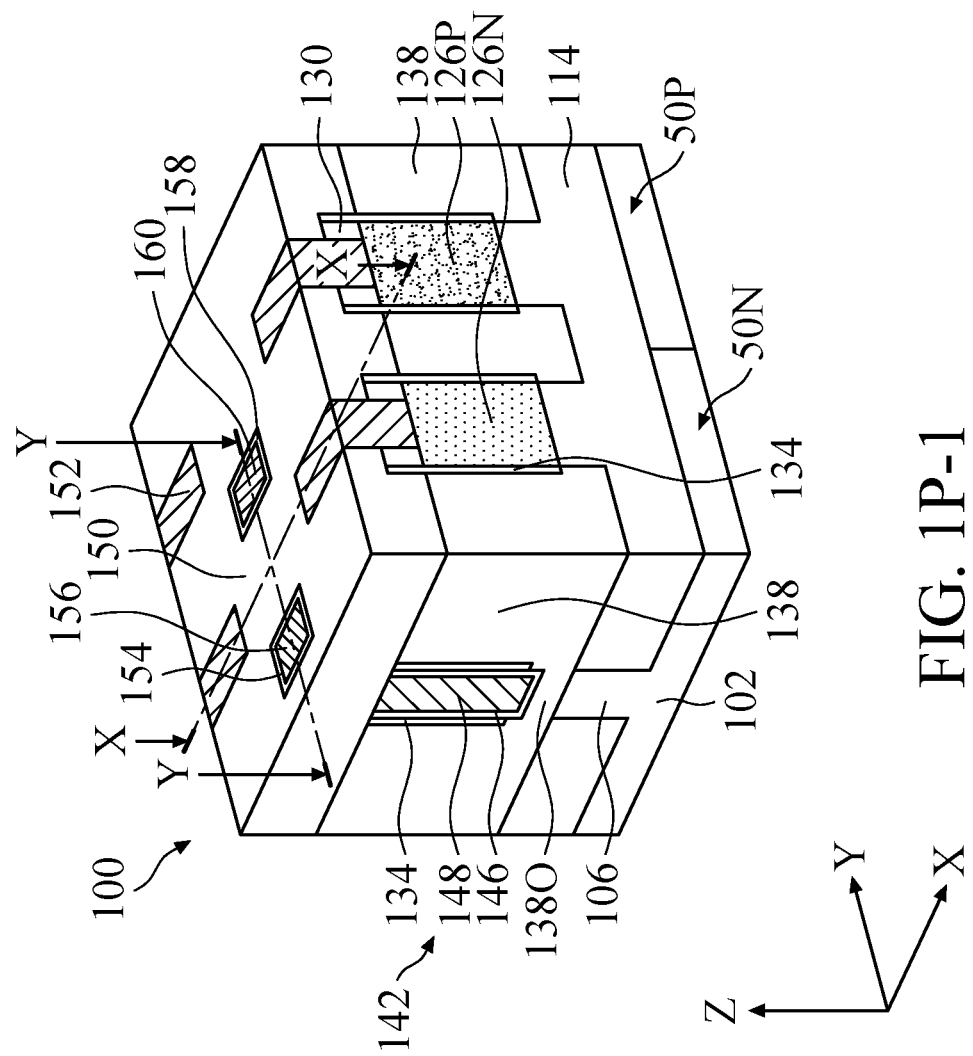
Figures 1, 1P, 2, 3:
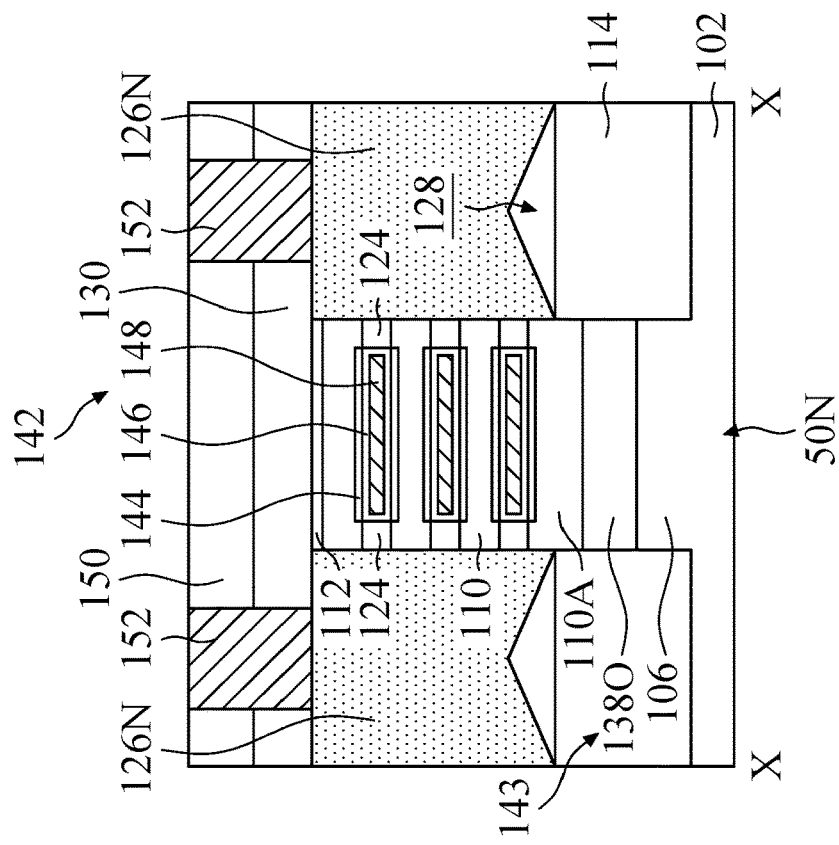
Figures 1, 1P, 2:
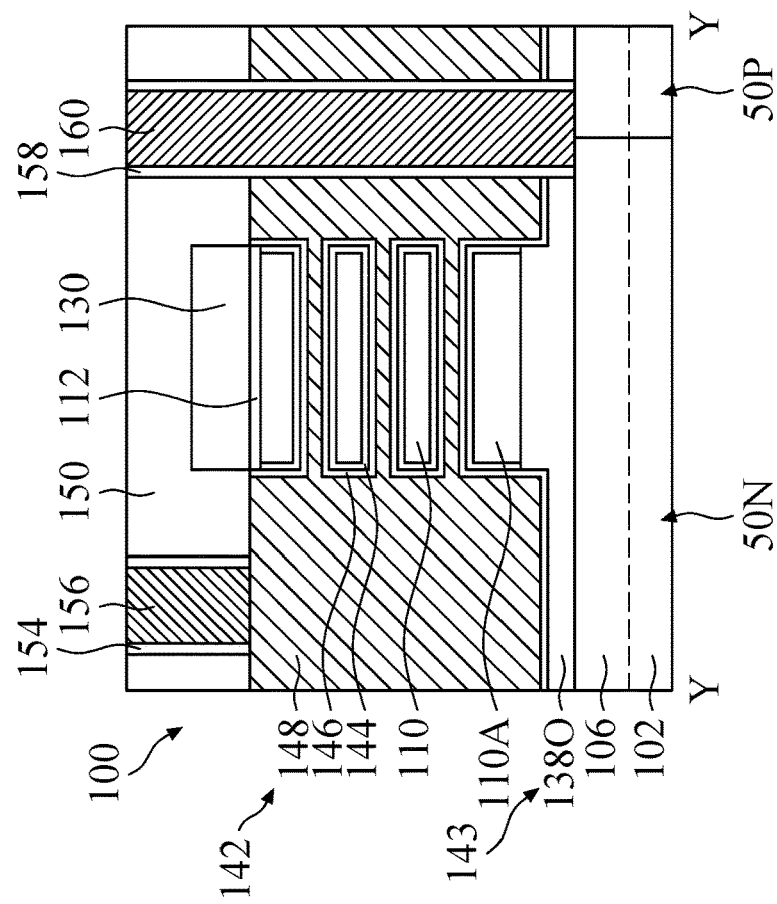

FIG. 1P-1 is a perspective view of a semiconductor structure 100 after the formation of a contact plug 156 and a contact plug 160, in accordance with some embodiments. FIG. 1P-2 and FIG. 1P-3 are cross-sectional views of the semiconductor structure 100 taken along Cross-section Y-Y and Cross-section X-X shown in FIG. 1P-1, in accordance with some embodiments.

A contact plug 156 is formed in and/or through the upper interlayer dielectric layer 150 and lands on the gate electrode layer 148, as shown in FIGS. 1P-1 and 1P-2, in accordance with some embodiments. A contact plug 160 is formed in and/or through the upper interlayer dielectric layer 150 and the gate stack 142 and lands on the gate electrode layer 106, as shown in FIGS. 1P-1 and 1P-2, in accordance with some embodiments.

The contact plug 156 is electrically connected to the gate electrode layer 148, in accordance with some embodiments. The contact plug 160 is electrically connected to the gate electrode layer 106, in accordance with some embodiments. The contact plug 156 and 160 may be also referred to as gate contacts or gate vias (VG).

In some embodiments, the formation of the contact plugs 156 and 160 includes patterning the upper interlayer dielectric layer 150 to form a contact opening (where the contact plug 156 is to be formed) exposing the gate electrode layer 148, and patterning the upper interlayer dielectric layer 150 and the final gate stack 142 to form a contact opening (where the contact plug 160 is to be formed) exposing the gate electrode layer 106. The patterning process may include photolithography and etching processes, and the contact openings for the contact plugs 156 and 160 may be formed simultaneously or separately.

Afterward, a silicide layer (such as WSi, NiSi, TiSi and/or CoSi) is formed on the exposed gate electrode layer 106. The formation of the contact plugs 156 and 160 also includes forming contact liners 154 and 158 along the sidewalls of the contact plugs using a deposition process and an etching back process. In some embodiments, the contact liners 154 and 158 are made of dielectric material such as silicon oxynitride (SiON), silicon nitride (SiN), silicon carbon nitride (SiCN), silicon oxycarbonitride (SiOCN), oxygen-doped silicon carbonitride (Si(O)CN), and/or silicon oxide ($SiO_2$).

The formation of the contact plugs 156 and 160 also includes depositing one or more conductive materials for the contact plugs 156 and 160 to fill the contact openings, and planarizing the one or more conductive materials over the top surface of the upper interlayer dielectric layer 150 using, for example, CMP. In some embodiments, the conductive material is deposited using CVD, PVD, e-beam evaporation, ALD, electroplating (ECP), electroless deposition (ELD), another suitable method, or a combination thereof. The deposition for the contact plugs 156 and 160 may be formed simultaneously or separately. After the planarization process, the top surfaces of the contact plugs 156 and 160 and the top surface of the upper interlayer dielectric layer 150 are substantially coplanar, in accordance with some embodiments.

The contact plugs 156 and 160 may have a multilayer structure including, for example, liner layers, glue layers, barrier layers, seed layers, metal bulk layers, another suitable layer, and/or a combination thereof. For example, a barrier layer (not shown) may optionally be formed along the sidewall and the bottom surface of the contact openings. The barrier layer is used to prevent the metal from the subsequently formed metal material from diffusing into the dielectric material (e.g., the upper interlayer dielectric layer 150). The barrier layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A glue layer (not shown) may optionally be formed along the sidewall and the bottom surface of the contact openings, and on the barrier layer (if formed). The glue layer is used to improve adhesion between the subsequently formed metal material and the dielectric material (e.g., the lower interlayer dielectric layer 150). The glue layer may be made of tantalum nitride (TaN), titanium (Ti), titanium nitride (TiN), another suitable material, and/or a combination thereof.

A metal bulk layer is then formed on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layers are made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

It is understood that the semiconductor structure 100 may undergo further CMOS processes to form various features over the semiconductor structure 100, such as a multilayer interconnect structure (e.g., vias, metal lines, inter metal dielectric layers, passivation layers, etc.).

As the scaling down of the nanostructure device (e.g., GAA transistor), the sheet-to-sheet space (e.g., the gap 140) becomes smaller and smaller, and thus less and less gate materials can be accommodated in the sheet-to-sheet space. Furthermore, the number of channels in the nanostructure transistor may increase in order to increase the on-current of the nanostructure transistor, but the increase in the number of channels may increase the difficulty of the manufacturing of the nanostructure transistor (such as etching and deposition processes). As a result, the nanostructure transistor (e.g., GAA transistor) may be difficult to meet the need for an input/output transistor that requires a gate dielectric layer having a great effective oxide thickness (EOT) and provide high on-current.

In accordance with some embodiments, the heavily-doped lower fin element 106 may be used as a gate electrode layer, and the gap 136 which is formed by removing the lowermost first semiconductor layer 108A may provide its full space to accommodate the lower interlayer dielectric layer 138 to form the gate dielectric layer 138O with a great EOT. The gate structure 143 including the gate electrode layer 106 and the gate dielectric layer 138O may meet the need for an input/output transistor. Therefore, input/out devices may be integrated into the manufacturing process for forming the nanostructure transistor, in accordance with some embodiments.

In accordance with some embodiments, the source/drain features 126N and 126P are formed over the isolation structure 114 rather than formed over the lower fin element. Because the isolation structure 114 has a great thickness (such as in a range from about 60 nm to about 120 nm), the leakage from the lower fin element and/or the substrate may be prevented, which may improve the performance of the resulting semiconductor device.

Figure 2A:
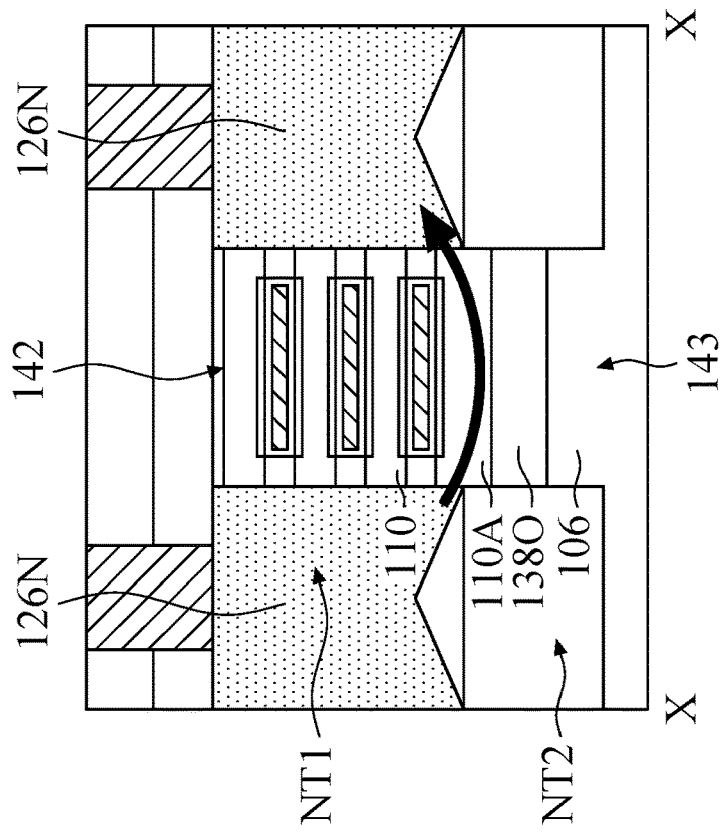
FIGS. 2A and 2B illustrate the flow of on-current During the operation, in accordance with some embodiments of the disclosure.
Figure 2B:
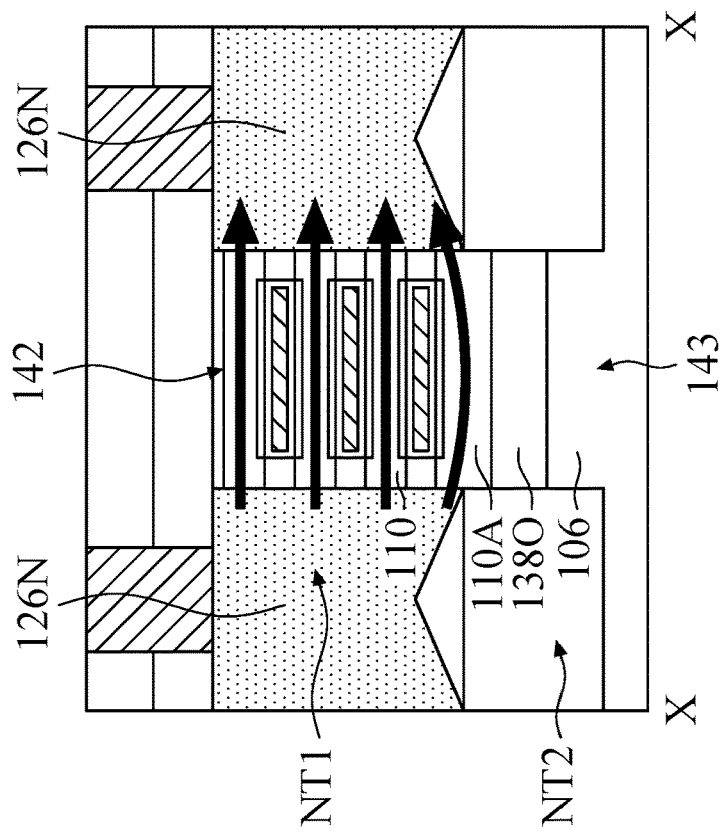
Figure 3:
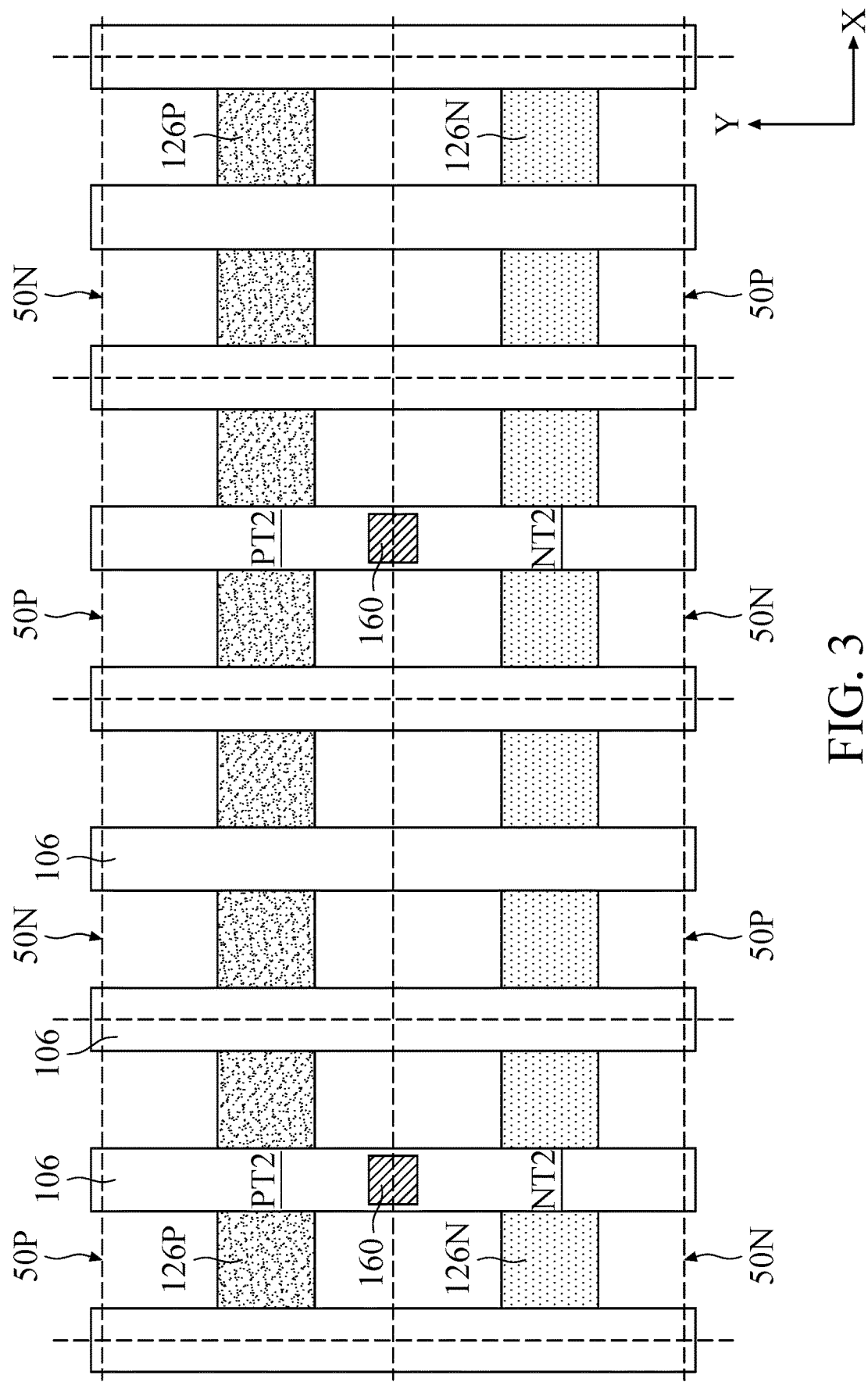
Figures 2, 4:
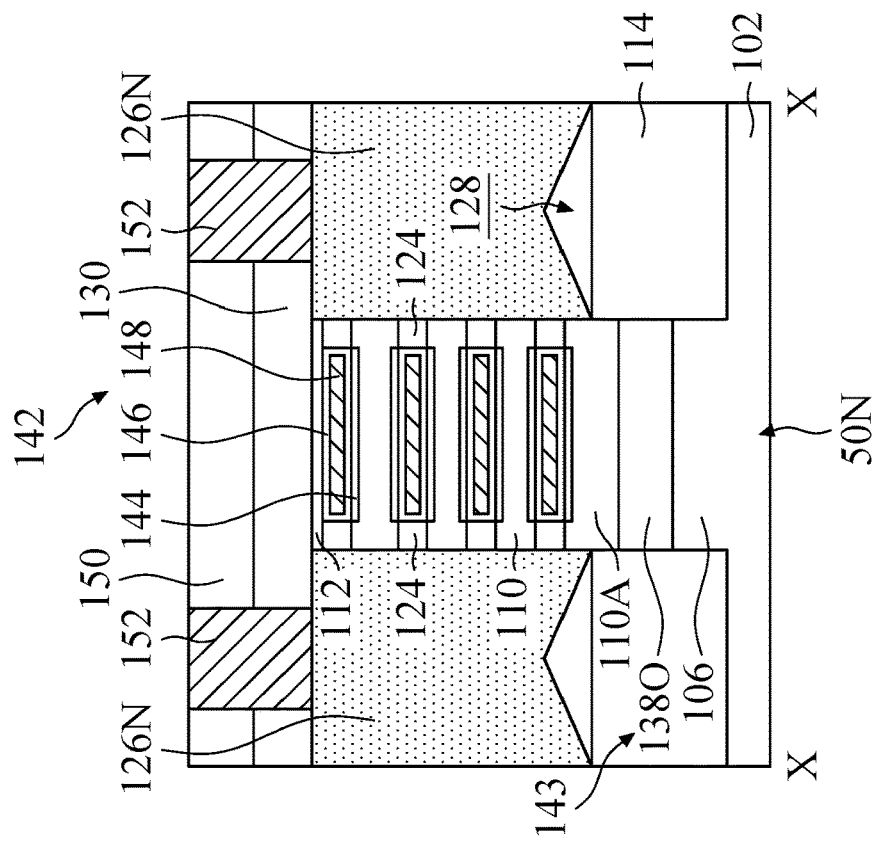
Figures 1, 4:
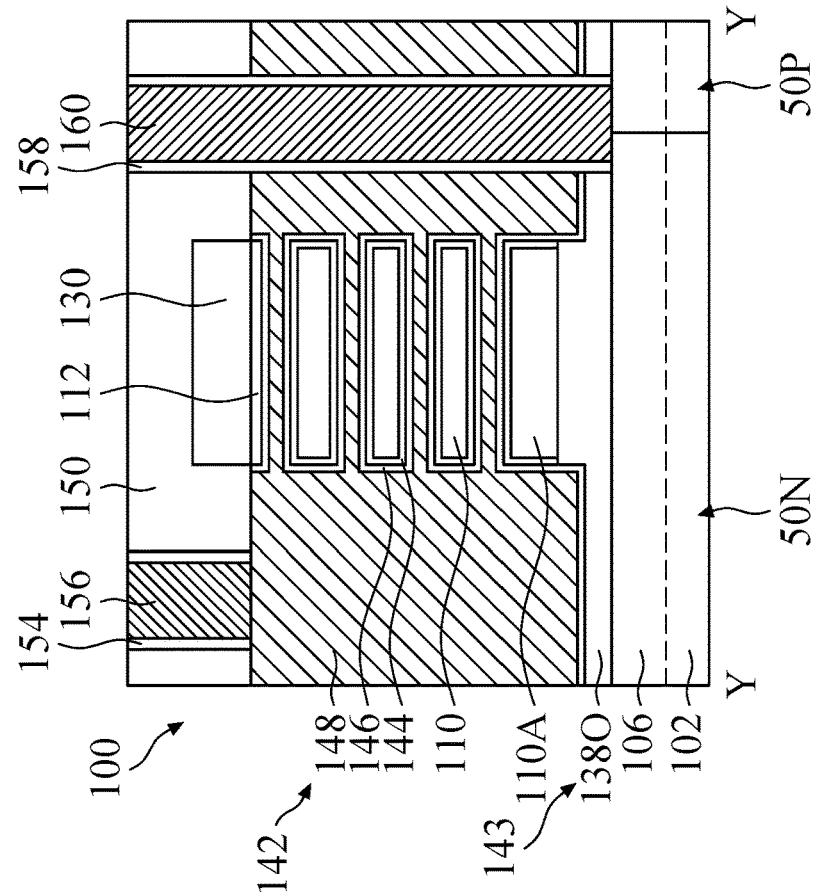

FIGS. 2A and 2B illustrate the flow of on-current During the operation, in accordance with some embodiments of the disclosure.

The gate stack 142 combines with the n-type source/drain features 126N to serve as an n-type core transistor NT1, as shown in FIG. 2A, in accordance with some embodiments. During the operation of the n-type core transistor NT1 (e.g., ON-state), the gate stack 142 may engage the nanostructures 110A and 110, such that current can flow between the n-type source/drain features 126N.

Although not illustrated, the gate stack 142 and the p-type source/drain features 126P may serve as a p-type core transistor. During the operation of the p-type core transistor, the gate stack 142 may engage the nanostructures 110A and 110, such that current can flow between the p-type source/drain features 126P.

The gate structure 143 combines with the n-type source/drain features 126N to serve as an n-type input/output transistor NT2, as shown in FIG. 2B, in accordance with some embodiments. During the operation of the n-type input/output transistor NT2 (e.g., ON-state), the gate structure 143 may engage the nanostructure 110A, such that current can flow between the n-type source/drain features 126N.

Although not illustrated, the gate structure 143 and the p-type source/drain features 126P may serve as a p-type input/output transistor. During the operation of the input/output transistor, the gate structure 143 may engage the nanostructure 110A, such that current can flow between the p-type source/drain features 126P.

FIG. 3 illustrates a layout of an input/output device, in accordance with some embodiments of the disclosure. The input/output device includes n-type input/output transistors NT2 and p-type input/output transistors PT2, as shown in FIG. 3, in accordance with some embodiments. The n-type input/output transistors NT2 and the p-type input/output transistors PT2 are formed by the method of the embodiments described above with respect to FIGS. 1A-1 through 1P-3, in accordance with some embodiments.

The n-type well regions 50N and the p-type well regions 50P are alternately arranged in the X direction and in the Y direction, as shown in FIG. 3, in accordance with some embodiments. That is, the n-type well regions 50N and the p-type well regions 50P have a checkerboard configuration, in accordance with some embodiments.

The n-type input/output transistors NT2 are formed in the n-type well regions thereby having n-type gate electrode layers 106, in accordance with some embodiments. The n-type input/output transistors NT2 are located at an intersection of the gate electrode layers 106 and the n-type source/drain features 126N, in accordance with some embodiments.

The p-type input/output transistors PT2 are formed in the p-type well regions thereby having p-type gate electrode layers 106, in accordance with some embodiments. The p-type input/output transistors PT2 are located at an intersection of the gate electrode layers 106 and the p-type source/drain features 126P, in accordance with some embodiments.

In some embodiments, the n-type input/output transistors NT2 and the p-type input/output transistors PT2 are disposed immediately adjacent to each other in the Y direction. A p-type well region 50P in which no input/output transistor is disposed, may be configured as an isolation layer to electrically isolate adjacent two n-type input/output transistors NT2 from one another, in accordance with some embodiments. An n-type well region 50N in which no input/output transistor is disposed, may be configured as an isolation layer to electrically isolate adjacent two p-type input/output transistors PT2 from one another, in accordance with some embodiments.

In some embodiments, an n-type well region 50N and a p-type well region 50P adjacent thereto may share one contact plug 160. In some embodiments, the contact plug 160 is disposed at the boundary between n-type well regions 50N and the p-type well regions 50P.

FIGS. 4-1 and 4-2 illustrate a modification of the semiconductor structure 100 of FIGS. 1P-2 and 1P-3, in accordance with some embodiments of the disclosure.

In some embodiments, the number of first semiconductor layers 108A and 108 is one more than the number of second semiconductor layers 110A and 110. For example, the number of first semiconductor layers 108A and 108 is five, and the number of second semiconductor layers 110A and 110 is four. As a result, the gate stack 142 (including the interfacial layer 144, the gate dielectric layer 146 and the metal gate electrode layer 148) is formed to entirely wrap around the topmost nanostructure 110 (by four sides), in accordance with some embodiments.

As described above, the aspect of the present disclosure is directed to integrating an input/output transistor into the manufacturing process for forming nanostructure transistors. In the manufacturing process for forming nanostructure transistors, the input/output transistor is formed by utilizing the heavily-doped lower fin element 106 as the gate electrode layer of the input/output transistor and replacing the lowermost first semiconductor layer 108A with the gate dielectric layer 138O of the input/output transistor, in accordance with some embodiments. The gate dielectric layer 138O may be formed with a great effective thickness, and thus may meet the need for the input/output transistor.

Furthermore, because the gate structure 143 of an input/output transistor extends parallel to the fin structure 104, the gate stack 142 of a core transistor, formed over the input/output transistor, is also designed to extend parallel to the fin structure 104, in accordance with some embodiments. Under such a design, the source/drain features 126N and 126P are formed on the isolation structure 114 to surround the channel region of the fin structure 104. The isolation structure 114 underlying the source/drain features 126N and 126P may prevent the leakage from the lower fin element and/or the substrate, which may improve the performance of the resulting semiconductor device.

In addition, the gate stack 142 of a core transistor is formed by cutting the fin structure (Cut-OD) late in the FEOL process. The removal of the first semiconductor layers 108 and the formation of the gate stack 142 are performed immediately after the cutting process, the risk of the formation of the diffusion path for germanium atoms may be substantially decreased. Therefore, Dit may be reduced, which may in turn improve the performance of the resulting semiconductor device.

Embodiments of a semiconductor structure and the method for forming the same may be provided. The semiconductor structure may include an input/output transistor and a core transistor over the input/output transistor. The input/output transistor may include a first nanostructure and a first gate electrode layer below the first nanostructure. The core transistor may include second nanostructures over the first nanostructure, and a second gate electrode layer wrapping around the second nanostructures. The lower fin element of the fin structure may be used as the first gate electrode layer of the input/output transistor, and the gate regions of the fin structure may be replaced with the second gate electrode layer. Therefore, the integration of input/output transistors into the manufacturing process for forming nanostructured transistors may be achieved.

In some embodiments, a method for forming a semiconductor structure is provided. The method includes forming a fin structure over a substrate. The fin structure includes alternately stacking first sacrificial layers and first channel layers. The method also includes forming source/drain features on opposite sidewalls of the fin structure, etching the fin structure to form gate recesses in the fin structure, removing the first sacrificial layers of the fin structure from the gate recesses, thereby forming first gaps that expose the first channel layers, and forming a gate stack in the gate recesses and the first gaps.

In some embodiments, a method for forming a semiconductor structure is provided. The method includes forming a fin structure over a substrate. The fin structure includes gate regions and channel regions alternately arranged. The method also includes forming dielectric walls extending across the gate regions of the fin structure, and forming first source/drain features in a first trench between the dielectric walls. One of the channel regions of the fin structure is sandwiched between the first source/drain features. The method also includes removing the dielectric walls, forming recesses in the gate regions of the fin structure, and forming a gate electrode layer in the recesses.

In some embodiments, a semiconductor structure is provided. The semiconductor structure includes a first transistor including a first nanostructure, a first gate electrode layer below the first nanostructure, and a first gate dielectric layer between the first nanostructure and the first gate electrode layer. The semiconductor structure also includes a second transistor over the first transistor, and the second transistor includes the second nanostructures over the first nanostructure, a second gate dielectric layer wrapping around the second nanostructures, and a second gate electrode layer over the second gate dielectric layer. The first gate dielectric layer and the second gate electrode layer are made of different materials, and the first gate dielectric layer is thicker than the second gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a fin structure over a substrate, the fin structure including alternately stacking first sacrificial layers and first channel layers;
   forming dielectric walls covering and extending across the fin structure;
   forming source/drain features on opposite sidewalls of the fin structure, wherein the source/drain features are formed in a trench defined between the dielectric walls;
   removing the dielectric walls after forming the source/drain features;
   etching the fin structure to form gate recesses in the fin structure;
   removing the first sacrificial layers of the fin structure from the gate recesses, thereby forming first gaps exposing the first channel layers; and
   forming a gate stack in the gate recesses and the first gaps.

2. The method for forming the semiconductor structure as claimed in claim 1, further comprising:
   laterally recessing, from the trench defined between the dielectric walls, the first sacrificial layers of the fin structure to form notches;
   forming inner spacers in the notches.

3. The method for forming the semiconductor structure as claimed in claim 1, further comprising:
   forming semiconductor walls covering and extending across the fin structure before forming the dielectric walls, wherein the semiconductor walls and the dielectric walls are alternately arranged; and
   removing the semiconductor walls after forming the dielectric walls.

4. The method for forming the semiconductor structure as claimed in claim 1, wherein the fin structure further comprises a lower fin element, a second sacrificial layer over the lower fin element, and a second channel layer over the second sacrificial layer, the first sacrificial layers and the first channel layers are stacked over the second sacrificial layer, and the second channel layer is thicker than one of the first channel layers.

5. The method for forming the semiconductor structure as claimed in claim 4, further comprising:
   forming an isolation structure over the substrate, wherein a lower portion of a sidewall of the second channel layer is covered by the isolation structure; and
   forming a spacer layer over the fin structure and the source/drain features, wherein an upper portion of the sidewall of the second channel layer is covered by the spacer layer.

6. The method for forming the semiconductor structure as claimed in claim 5, further comprising:
   recessing the isolation structure to expose the lower portion of a sidewall of the second channel layer and a sidewall of the second sacrificial layer; and
   removing the second sacrificial layer of the fin structure, thereby forming a second gap exposing the second channel layer and the lower fin element of the fin structure.

7. The method for forming the semiconductor structure as claimed in claim 6, further comprising:
   forming a dielectric layer over the isolation structure, wherein the second gap is filled by the dielectric layer.

8. The method for forming the semiconductor structure as claimed in claim 4, further comprising:
   forming an opening through the gate stack and a portion of the dielectric layer filling in the second gap until the lower fin element is exposed;
   forming a dielectric liner along sidewalls of the opening; and
   forming a contact plug in the opening and surrounded by the dielectric liner.

9. The method for forming the semiconductor structure as claimed in claim 1, wherein the step of etching the fin structure to form the gate recesses in the fin structure is performed after the step of forming the source/drain features on the opposites sidewalls of the fin structure.

10. A method for forming a semiconductor structure, comprising:
    forming a fin structure over a substrate, wherein the fin structure includes gate regions and channel regions alternately arranged;
    forming dielectric walls extending across the gate regions of the fin structure;
    forming first source/drain features in a first trench between the dielectric walls, wherein one of the channel regions of the fin structure is sandwiched between the first source/drain features;
    removing the dielectric walls;
    forming a mask layer covering the channel regions of the fin structure and the first source/drain features before removing the dielectric walls;
    etching the gate regions of the fin structure using the mask layer, thereby forming recesses in the gate regions of the fin structure; and
    forming a gate electrode layer in the recesses.

11. The method for forming the semiconductor structure as claimed in claim 10, wherein the fin structure extends in a first direction, and the dielectric walls extend in a second direction substantially perpendicular to the first direction.

12. The method for forming the semiconductor structure as claimed in claim 10, further comprising:
forming an isolation structure to cover a lower portion of the fin structure;
forming a lining layer to cover an upper portion of the fin structure; and
forming semiconductor walls over the lining layer and extending across the fin structure; and
removing the semiconductor walls after forming the dielectric walls.

13. The method for forming the semiconductor structure as claimed in claim 10, further comprising:
forming second source/drain features in a second trench between the dielectric walls, wherein another one of the channel regions of the fin structure is sandwiched between the second source/drain features, wherein the first source/drain features and the second source/drain features have different electrical conductivity types.

14. The method for forming the semiconductor structure as claimed in claim 10, further comprising:
implanting a first region of the substrate with an n-type dopant to form an n-type well region;
implanting a second region of the substrate with a p-type dopant to form a p-type well region;
forming an epitaxial stack over the substrate; and
etching the epitaxial stack and the substrate to form the fin structure, wherein the fin structure extends through both the n-type well region and the p-type well region, wherein the first source/drain features are doped with an n-type dopant and formed in the n-type well region.

15. The method for forming the semiconductor structure as claimed in claim 10, wherein the fin structure includes alternately stacking first semiconductor layers and second semiconductor layers, and bottom surfaces of the recesses are lower than a bottom surface of a lowermost one of the second semiconductor layers.

16. A method for forming a semiconductor structure, comprising:
forming a stack including a sacrificial layer and a channel layer over the sacrificial layer;
patterning the stack to form a fin structure;
forming an isolation structure covering sidewalls of the sacrificial layer of the fin structure;
forming a first source/drain feature and a second source/drain feature on opposite sides of the fin structure;
recessing the isolation structure to expose the sidewalls of the sacrificial layer of the fin structure;
removing the sacrificial layer of the fin structure to form a gap; and
depositing a dielectric material to fill the gap.

17. The method for forming the semiconductor structure as claimed in claim 16, wherein the first source/drain feature and the second source/drain feature are formed on a top surface of the isolation structure.

18. The method for forming the semiconductor structure as claimed in claim 16, further comprising:
forming a gate stack surrounding the channel layer, wherein the gate stack is longitudinally oriented along a first horizontal direction, and the fin structure is longitudinally oriented along the first horizontal direction.

19. The method for forming the semiconductor structure as claimed in claim 16, further comprising:
forming a first dummy wall and a second dummy wall across the fin structure, wherein the first source/drain feature and the second source/drain feature are formed between a trench between the first dummy wall and the second dummy wall.

20. The method for forming the semiconductor structure as claimed in claim 16, further comprising:
forming spacer layers alongside the fin structure after forming the first source/drain feature and the second source/drain feature and before depositing the dielectric material.

* * * * *